United States Patent
Goodman et al.

(10) Patent No.: US 6,454,865 B1
(45) Date of Patent: Sep. 24, 2002

(54) LOW MASS WAFER SUPPORT SYSTEM

(75) Inventors: Matthew G. Goodman, Tempe; Ivo Raaijmakers, Phoenix; Loren R. Jacobs, Mesa; Franciscus B. M. van Bilsen, Phoenix; Michael J. Meyer, Tempe; Eric Alan Barrett, Mesa, all of AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/981,537

(22) Filed: Oct. 17, 2001

Related U.S. Application Data

(62) Division of application No. 09/184,757, filed on Nov. 2, 1998, now abandoned.
(60) Provisional application No. 60/064,016, filed on Nov. 3, 1997.

(51) Int. Cl.[7] .............................................. C23C 16/00
(52) U.S. Cl. ....................................... 118/728; 118/500
(58) Field of Search ................................... 118/728, 500

(56) References Cited

U.S. PATENT DOCUMENTS

| | | | |
|---|---|---|---|
| 3,407,783 A | 10/1968 | Capita | |
| 3,549,847 A | 12/1970 | Clark et al. | |
| 3,641,974 A | 2/1972 | Yamada et al. | |
| 4,522,149 A | 6/1985 | Garbis et al. | |
| 4,560,420 A | 12/1985 | Lord | |
| 4,710,428 A | 12/1987 | Tamamizu et al. | |
| 4,958,061 A | 9/1990 | Wakabayashi et al. | |
| 4,978,567 A | 12/1990 | Miller | |
| 4,990,374 A | 2/1991 | Keeley et al. | |
| 5,033,407 A | 7/1991 | Mizuno et al. | |
| 5,044,943 A | 9/1991 | Bowman et al. | |
| 5,098,198 A | * 3/1992 | Nulman ....................... | 374/121 |
| 5,108,792 A | 4/1992 | Anderson et al. | |
| 5,119,540 A | 6/1992 | Kong et al. | |
| 5,119,541 A | 6/1992 | Ohmi et al. | |

(List continued on next page.)

FOREIGN PATENT DOCUMENTS

| | | |
|---|---|---|
| EP | 0339279 A2 | 11/1989 |
| EP | 0 448 346 A1 | 3/1991 |
| EP | 0445596 A2 | 9/1991 |
| EP | 0634785 A1 | 1/1995 |
| EP | 0669640 A1 | 8/1995 |
| EP | 0 766 289 A2 | 4/1997 |
| EP | 0840358 A2 | 5/1998 |
| JP | 7-58039 | 3/1995 |
| WO | WO 97/08743 | * 3/1997 |

OTHER PUBLICATIONS

"Shaping the Future in Semiconductor Processing." Advertisement for Morton International, Inc., *Ceramic Solutions.* vol. 73, No. 7, Jul. 1994: advertisements (circa 1993).

*Primary Examiner*—Richard Bueker
(74) *Attorney, Agent, or Firm*—Knobbe, Martens, Olson & Bear, LLP

(57) ABSTRACT

Improvements in the design of a low mass wafer holder are disclosed. The improvements include the use of peripherally located, integral lips to space a wafer or other substrate above the base plate of the wafer holder. A uniform gap is thus provided between the wafer and the base plate, such as will temper rapid heat exchanges, allow gas to flow between the wafer and wafer holder during wafer pick-up, and keep the wafer holder thermally coupled with the wafer. At the same time, thermal disturbance from lip contact with the wafer is reduced. Gas flow during pick-up can be provided through radial channels in a wafer holder upper surface, or through backside gas passages. A thicker ring is provided at the wafer holder perimeter, and is provided in some embodiments as an independent piece to accommodate stresses accompanying thermal gradients. Self-centering mechanisms are provided to keep the wafer holder centered relative to a spider which is subject to differential thermal expansion.

14 Claims, 22 Drawing Sheets

U.S. PATENT DOCUMENTS

| | | | |
|---|---|---|---|
| 5,121,531 A | | 6/1992 | Severns et al. |
| 5,156,820 A | | 10/1992 | Wong et al. |
| 5,199,483 A | | 4/1993 | Bahng |
| 5,200,157 A | | 4/1993 | Toya et al. |
| 5,298,465 A | | 3/1994 | Levy |
| 5,306,699 A | | 4/1994 | Eddy |
| 5,308,645 A | | 5/1994 | Zachman et al. |
| 5,332,442 A | | 7/1994 | Kubodera et al. |
| 5,343,938 A | | 9/1994 | Schmidt |
| 5,354,715 A | | 10/1994 | Wang et al. |
| 5,356,486 A | | 10/1994 | Sugarman et al. |
| 5,370,739 A | | 12/1994 | Foster et al. |
| 5,383,971 A | | 1/1995 | Selbrede |
| 5,393,349 A | | 2/1995 | Ohkase |
| 5,403,401 A | | 4/1995 | Haafkens et al. |
| 5,444,217 A | | 8/1995 | Moore |
| 5,456,757 A | | 10/1995 | Aruga et al. |
| 5,467,220 A | | 11/1995 | Xu |
| 5,492,566 A | | 2/1996 | Sumnitsch |
| 5,514,439 A | | 5/1996 | Sibley |
| 5,527,393 A | * | 6/1996 | Sato ........................ 118/728 |
| 5,549,756 A | | 8/1996 | Sorensen |
| 5,551,985 A | | 9/1996 | Brors et al. |
| 5,558,717 A | | 9/1996 | Zhao |
| 5,584,936 A | * | 12/1996 | Pickering ................ 118/728 |
| 5,620,525 A | | 4/1997 | van de Ven et al. |
| 5,645,646 A | | 7/1997 | Beinglass et al. |
| 5,656,093 A | | 8/1997 | Burkhart et al. |
| 5,683,518 A | | 11/1997 | Moore et al. |
| 5,700,725 A | | 12/1997 | Hower et al. |
| 5,738,165 A | | 4/1998 | Imai |
| 5,803,977 A | | 9/1998 | Tepman |
| 5,938,850 A | * | 8/1999 | Arami ...................... 118/728 |
| 6,090,212 A | * | 7/2000 | Mahawili .................. 118/728 |

\* cited by examiner

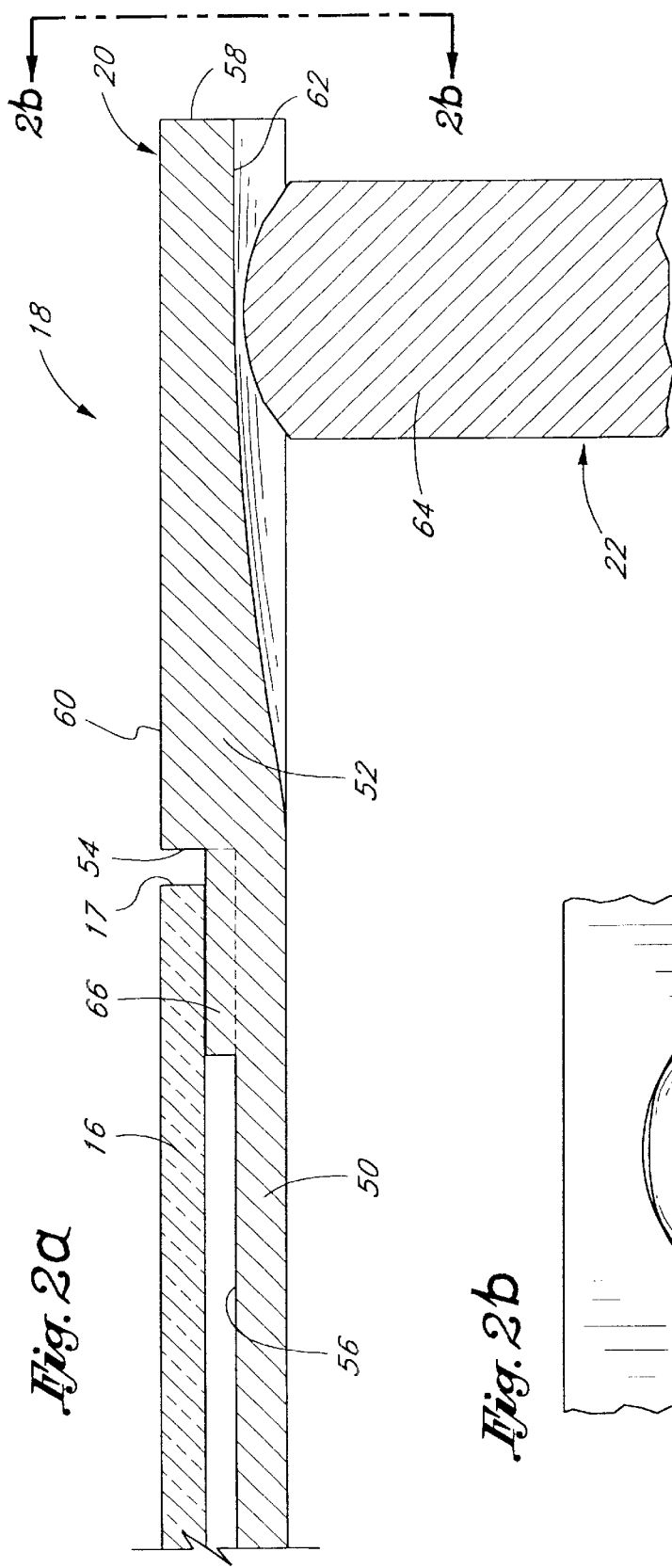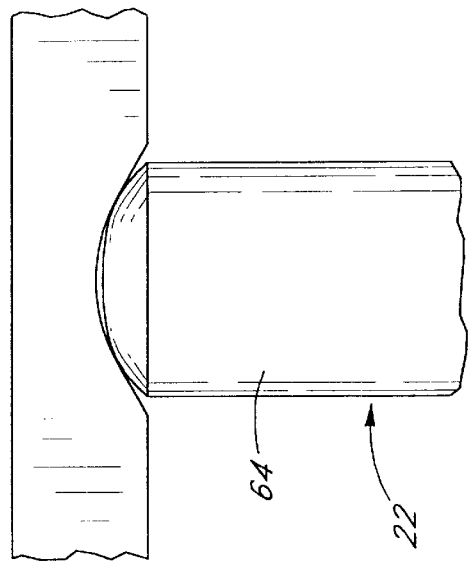

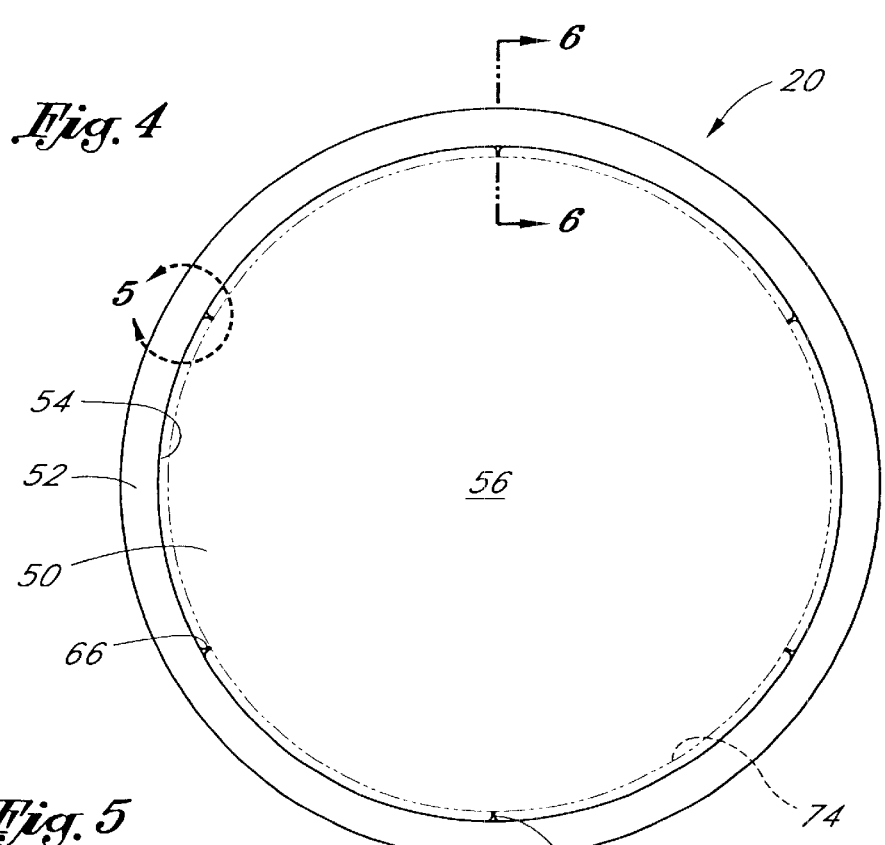
Fig. 4
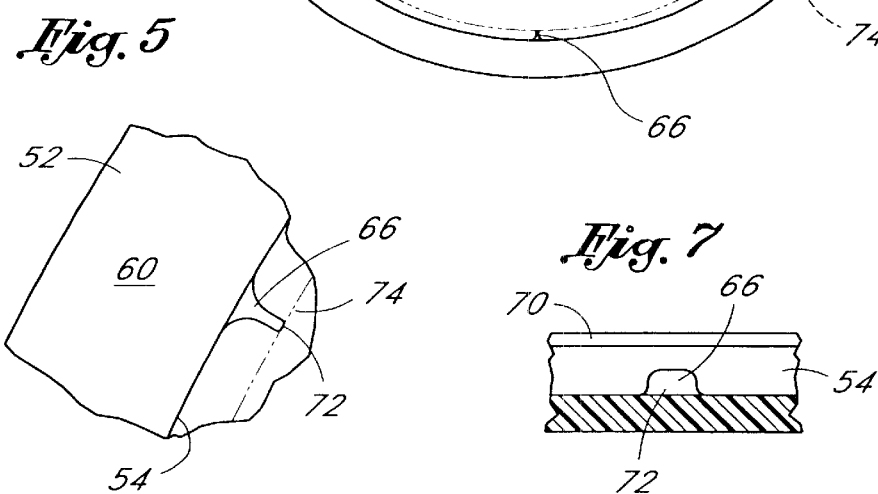
Fig. 5
Fig. 7
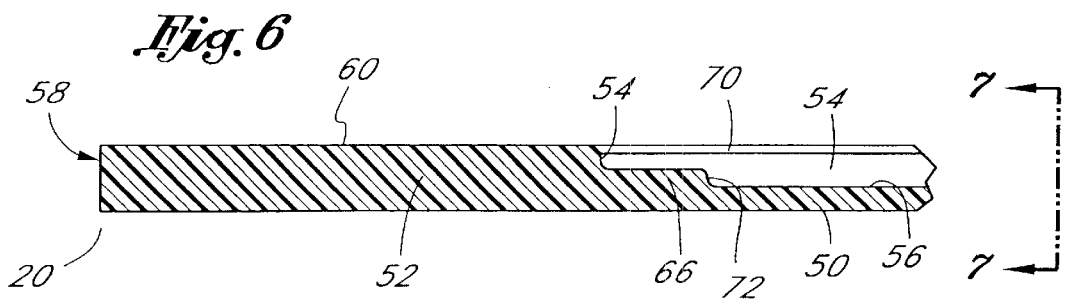
Fig. 6

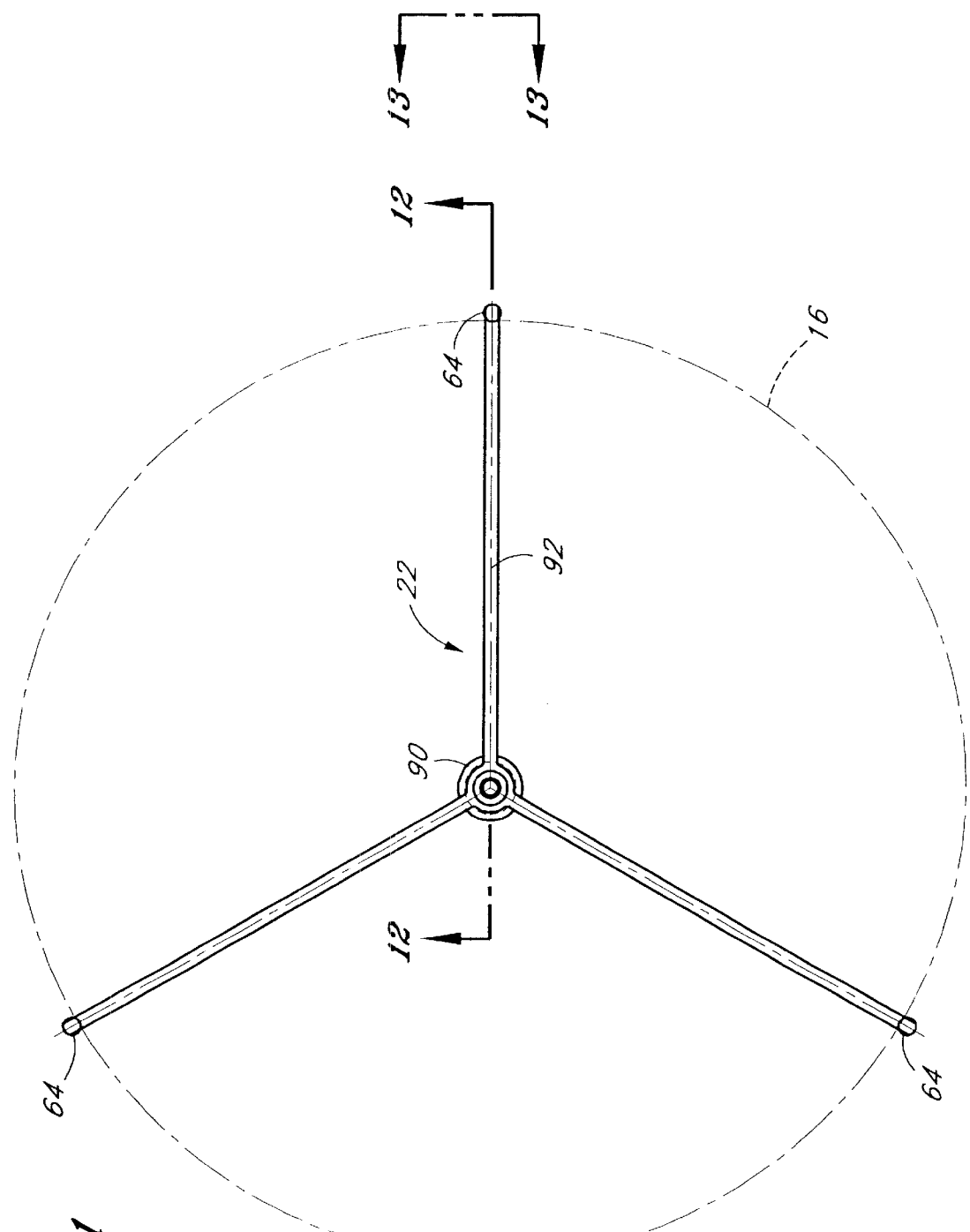

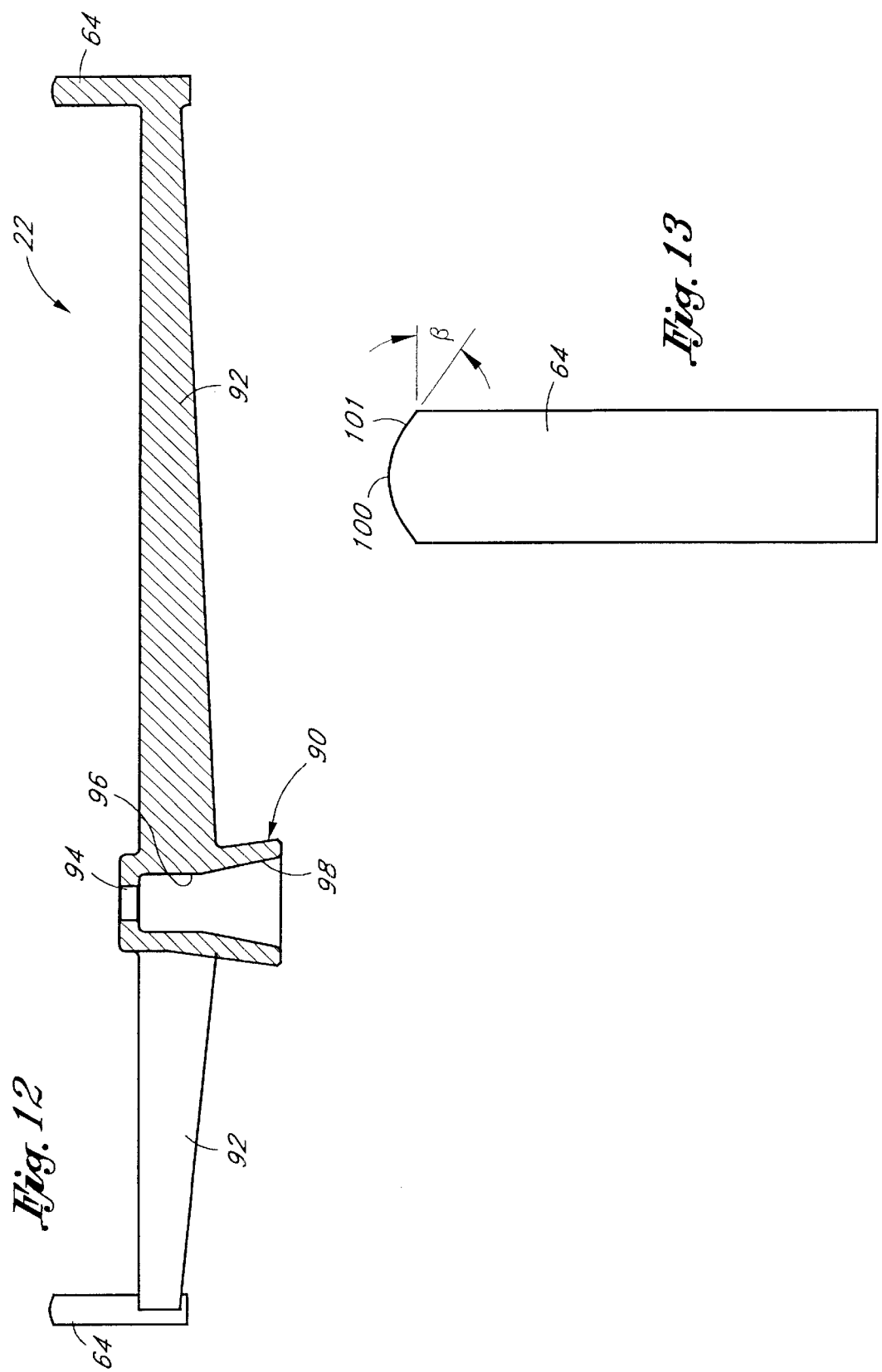

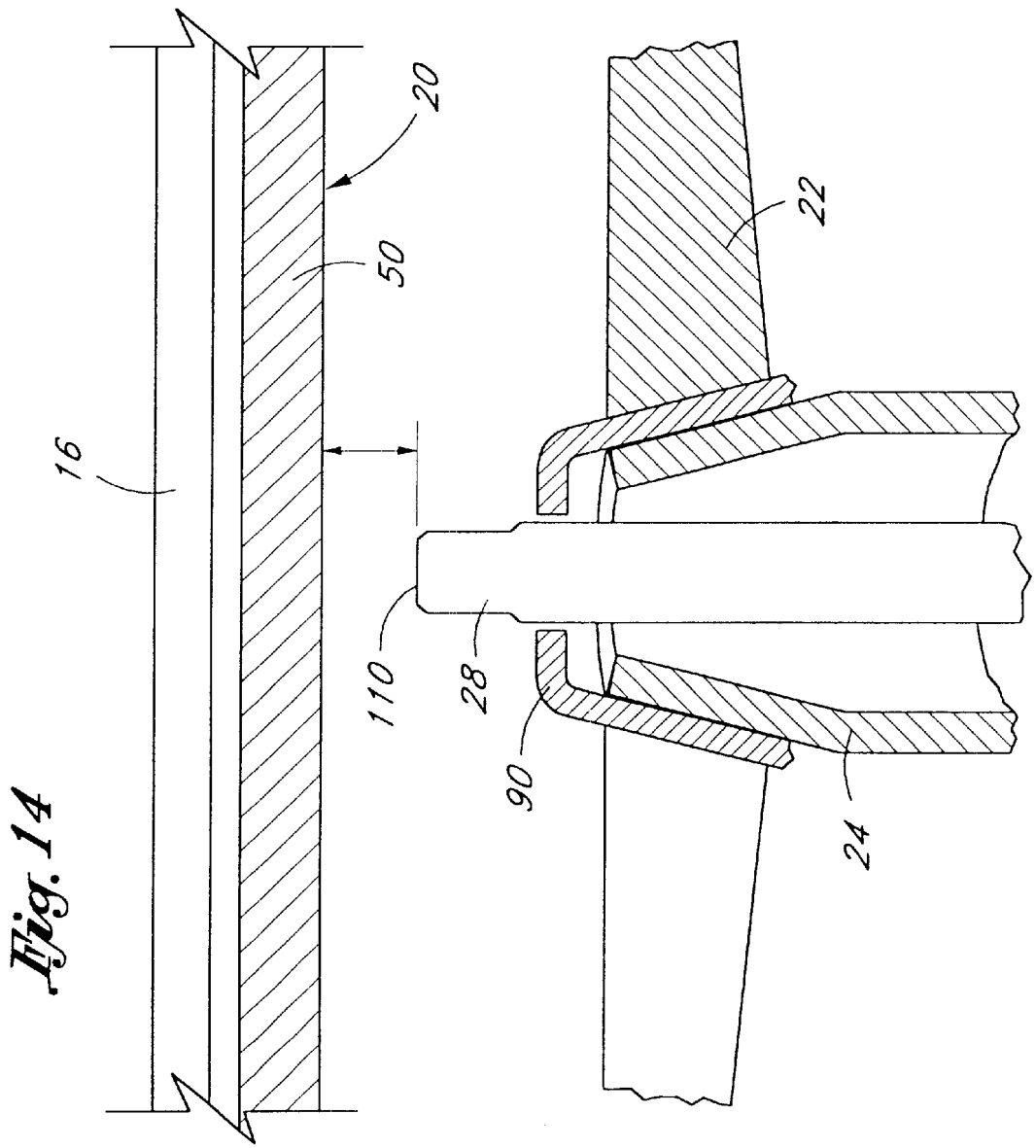

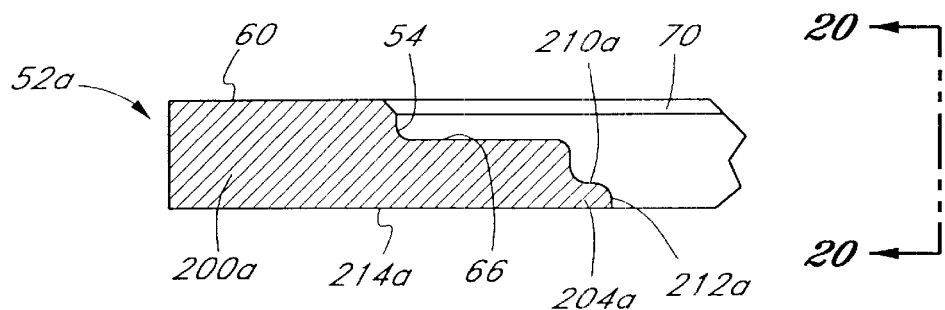
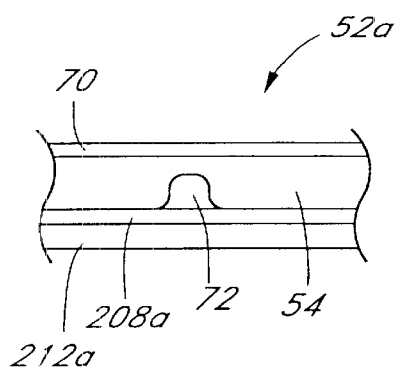
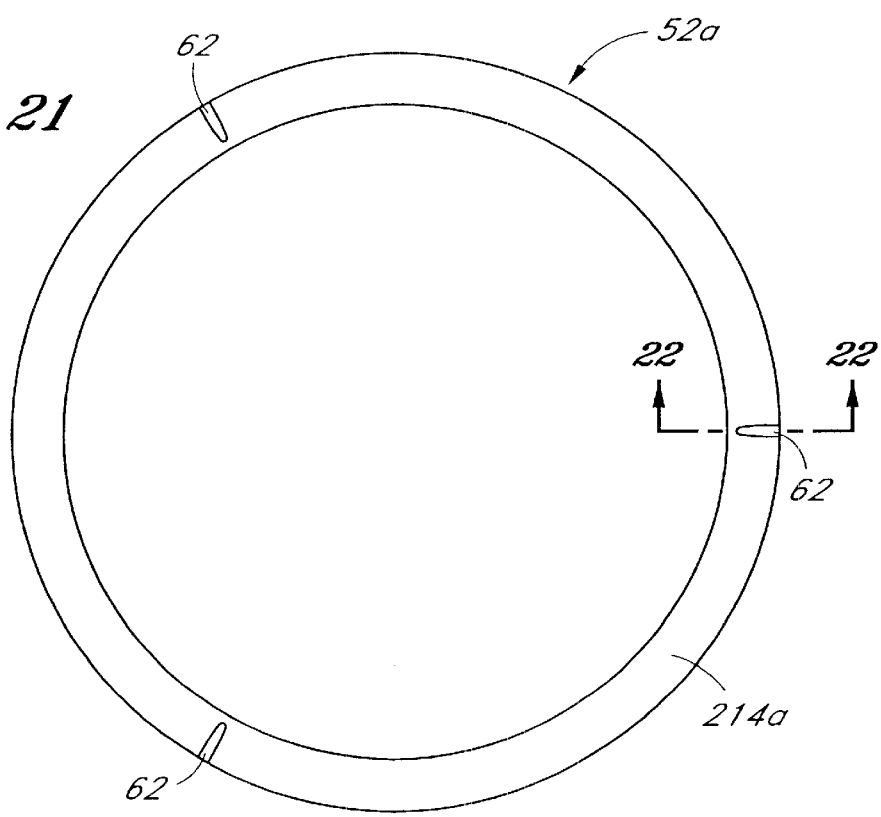

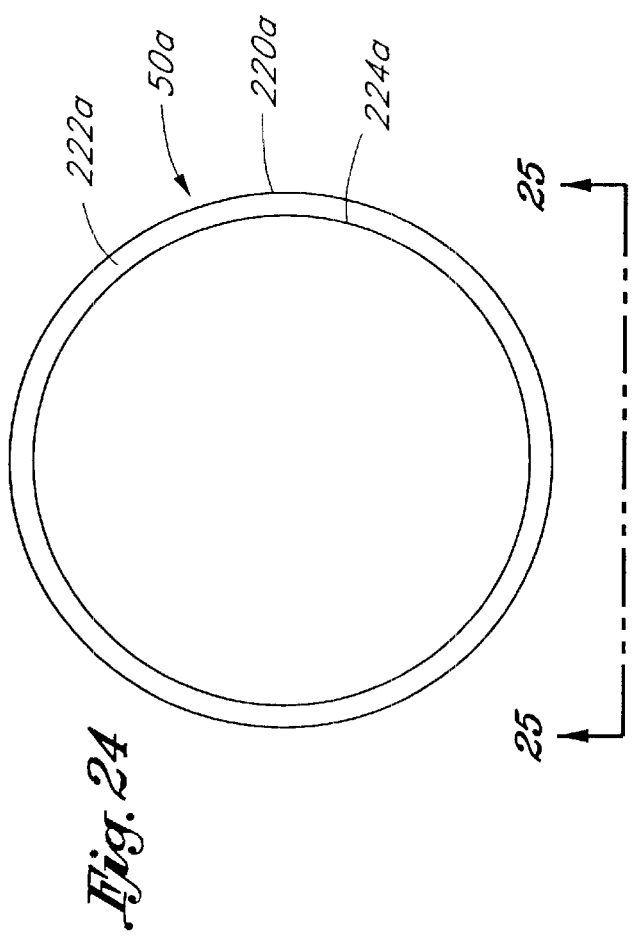
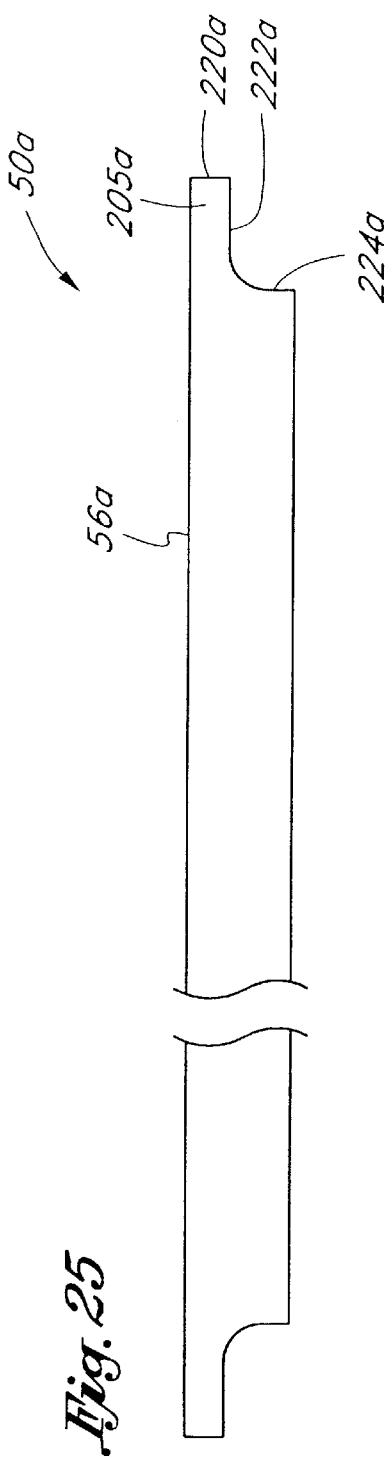

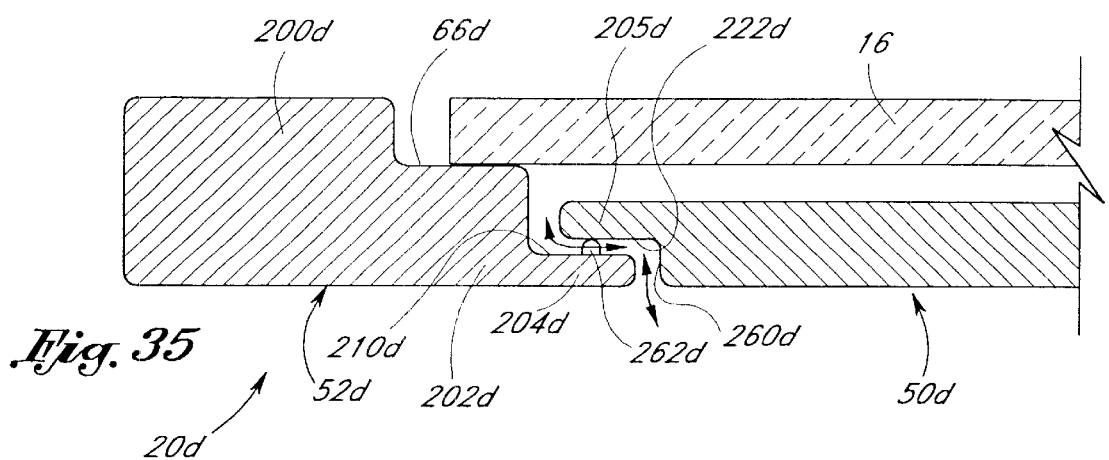
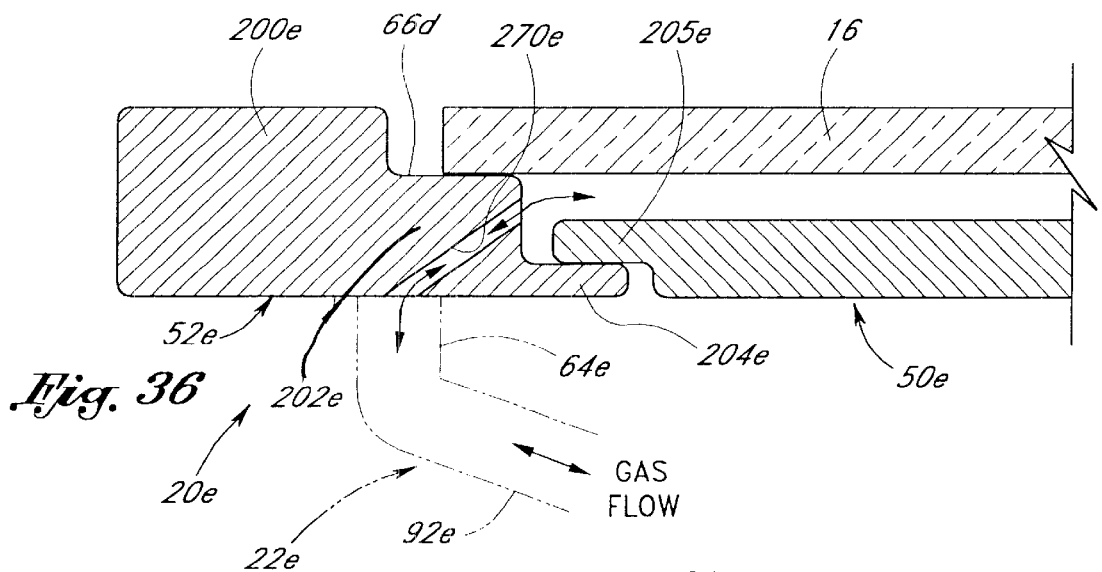
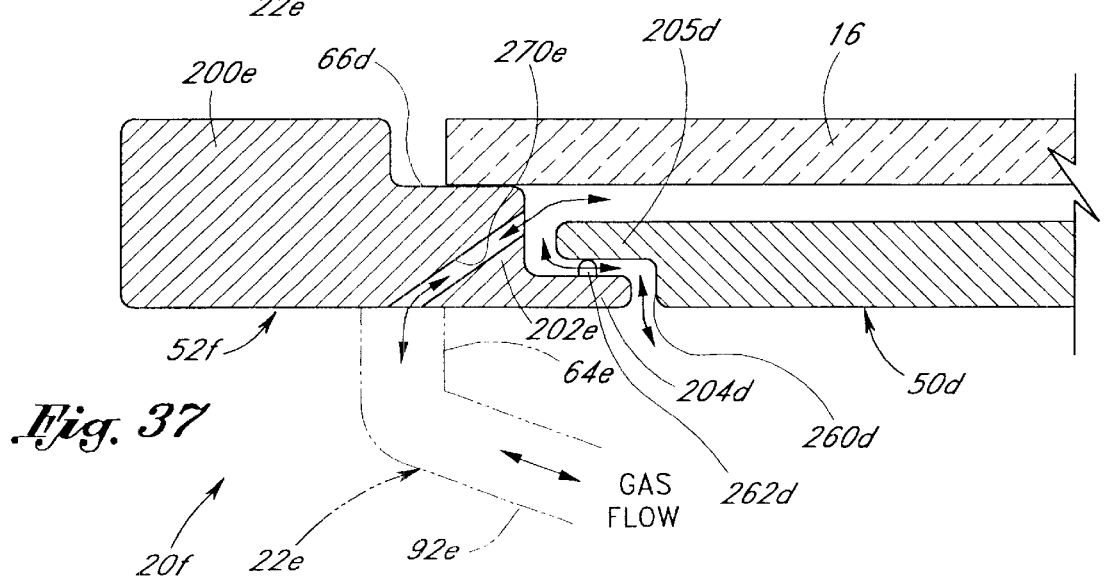

LOW MASS WAFER SUPPORT SYSTEM

REFERENCE TO RELATED APPLICATION

This application is a divisional application of Application Ser. No. 09/184,757, filed Nov. 2, 1998, abandoned, which claims the priority benefit under 35 U.S.C. §119 (e) from provisional Application No. 60/064,016 of Goodman et al., filed Nov. 3, 1997.

FIELD OF THE INVENTION

The present invention relates to support structures for substrates in semiconductor processing chambers, and more particularly to low mass support structures for supporting wafers within a single-wafer processing chamber.

BACKGROUND OF THE INVENTION

High-temperature ovens, called reactors, are used to create structures of very fine dimensions, such as integrated circuits on semiconductor wafers or other substrates. A circular substrate, typically a silicon wafer, is placed on a wafer support. Both the wafer and support are heated, typically by a plurality of radiant lamps placed around a quartz chamber. In a typical process, a reactant gas is passed over the heated wafer, causing the chemical vapor deposition (CVD) of a thin layer of the reactant material on the wafer. Through subsequent processes, these layers are made into integrated circuits, with a single layer producing from tens to thousands of integrated circuits, depending on the size of the wafer and the complexity of the circuits. Other processes include sputter depositions, photolithography, dry etching, plasma processes. and high temperature anneals. Many of these processes require high temperature steps and can be performed in similar quartz reaction chambers.

If the deposited layer has the same crystallographic structure as the underlying silicon wafer, it is called an epitaxial layer. This is also sometimes called a monocrystalline layer because it has only one crystal structure.

Various process parameters must be carefully controlled to ensure the high quality of the resulting layers. One such critical parameter is the temperature of the wafer during the processing. During CVD, for example, the deposition gas reacts at particular temperatures and deposits on the wafer. If the temperature varies greatly across the surface of the wafer, uneven deposition of the reactant gas occurs.

In certain batch processors (i.e., reactors which process more than one wafer at a time) wafers are placed on a relatively large-mass susceptor made of graphite or other heat-absorbing material to help the temperature of the wafers remain uniform. In this context, a "large-mass" susceptor is one which has a large thermal mass relative to the wafer. The thermal mass of a solid, or its lumped thermal capacitance, is given by the equation:

$$C_T = \rho V c$$

where:
 $\rho$=the density of the solid,
 V=the volume of the solid, and
 c=the specific heat (heat capacity) of the solid.
Thus, the thermal mass is directly related to its mass, which is equal to the density times volume and to its specific heat.

One example of a large-mass susceptor is shown in U.S. Pat. No. 4,496,609 issued to McNeilly, which discloses a CVD process wherein the wafers are placed directly on a relatively large-mass slab-like susceptor and maintained in intimate contact to permit a transfer of heat therebetween. The graphite susceptor supposedly acts as a heat "flywheel" which transfers heat to the wafer to maintain its temperature uniform. The goal is to reduce transient temperature variations around the wafer that would occur without the "flywheel" effect of the susceptor.

Although large-mass susceptors theoretically aid in maintaining temperature uniformity across the wafers when the system is in a steady state, the large thermal mass of the susceptor makes the susceptor-wafer combination slow in responding to temperature transients (e.g., while heating up or cooling down the system). Accordingly, processing wafers with large-mass susceptors involves long thermal cycles, limiting the number of wafers which can be processed in a given length of time (i.e., limiting process throughput). High throughput remains a prime concern in single-wafer semiconductor processing.

In recent years, single-wafer processing of larger diameter wafers has grown for a variety of reasons including greater precision process control as compared to batch-processing. Typical wafers are made of silicon with one common size having a diameter of 200 mm and a thickness of 0.725 mm. Recently, larger silicon wafers having a diameter of 300 mm and a thickness of 0.775 mm have been introduced, as they even more efficiently exploit the benefits of larger single-wafer processing. Additionally, even larger wafers are contemplated for the future.

Although single-wafer processing by itself provides advantages over batch processing, control of the process parameters remains critical and is perhaps more so because of the increased cost of the larger wafers. One example of a single-wafer processor is shown in U.S. Pat. No. 4,821,674, which utilizes a circular rotatable susceptor having a diameter slightly larger than the wafer. This susceptor is preferably made of graphite and has a lower thermal mass than the aforementioned slab-type batch processing susceptor. Nevertheless, the thermal mass of a production version of the susceptor described in U.S. Pat. No. 4,821,674 is larger than the thermal mass of the single wafer, such that thermal cycle time for the system is limited.

U.S. Pat. No. 4,978,567 describes a wafer holding fixture of lower mass than conventional susceptors. The lower mass facilitates rapid heating and cooling of the wafer for Rapid Thermal Processing (RTP) systems. Throughput can also be increased in connection with other processes involving heating or cooling of a substrate to be processed.

Processing wafers with such a low-mass wafer holder, however, introduces new problems. For example, the low mass of the wafer holder, combined with a small gap between the wafer and holder, makes it difficult to lift a wafer off the holder without also lifting the wafer holder. A vacuum effect causes the wafer and holder to stick together. As gas starts to fill the small gap, the gap will increase and the gas will flow faster. Accordingly, the holder will drop shortly after pick-up. Obviously such an uncontrolled drop can cause damage to the wafer holder and surrounding equipment within the reaction chamber. Additionally, particulate matter created by such damage can contaminate processed wafers.

The very rapidity of thermal response for which the low mass wafer holder is designed can also cause damage to the wafer and to reactor parts. For example, when first introduced into a reaction chamber, the wafer may be cold (e.g., 200° C.), while the wafer holder remains hot (e.g., 900° C.) from processing a prior wafer. Bringing the cold wafer into contact with a hot wafer holder causes a rapid heat drain from the holder to the wafer. The low mass wafer holder rapidly drops in temperature, as compared to the rate at which a high mass susceptor would drop, until the wafer and wafer holder are in thermal equilibrium. The wafer, in the interim, undergoes a rapid heat influx. The rapid temperature fluctuation causes thermal shock to both the wafer and the holder. Both the wafer and holder tend to bow under the strain of vertical and radial temperature gradients during the transition. The stress can often cause breakage of the wafer holder and, occasionally, even the wafer.

The lower mass wafer holder is also susceptible to thermal expansion during heating. Due to differences in equipment material, the wafer holder will tend to expand at a different rate, as compared to surrounding equipment. In particular, a structure for supporting and rotating the wafer holder during processing is often constructed of quartz, such that radiant heat from below will largely pass through this structure. A typical graphite or silicon carbide (SiC) wafer holder expands significantly more rapidly than the quartz structure.

Relative movement between the supporting quartz and the wafer holder due to differences in thermal expansion can cause decentering of the wafer holder and the wafer upon it. Decentering, in turn, can tilt the wafer holder or otherwise upset a carefully balanced relationship between reactor elements and the wafer, configured for achieving temperature uniformity. Furthermore, eccentricity will exacerbate the decentration, such that the wafer holder can come in contact with a slip ring or other adjacent structure, bumping or rubbing against these structures during rotation and potentially introducing particulate matter into the reactor. Decentering can thus cause non-uniformity in the quality and thickness of deposited layers, for instance.

Consequently, there is a need for an improved low mass wafer support structure to increase throughput of semiconductor processing devices while ensuring temperature uniformity across the wafer surface. Desirably, such a support structure should avoid the above-noted problems associated with wafer pick-up, thermal shock, and thermal expansion.

SUMMARY OF THE INVENTION

In accordance with one aspect of the present invention, a low mass wafer holder is provided for supporting a substrate within a process reactor. The holder has an upper surface and a lower surface, with a plurality of lips integral with the upper surface. Because the lips are integral, the lips can be machined to a uniform height above the upper surface, thereby supporting the substrate with a uniform gap between substrate and the upper surface. In one embodiment, the upper surface is discontinuous, including the top surface of a peripheral supporting ring, as well as the top surface of a central base plate.

In accordance with another aspect of the present invention, a wafer holder for is provided for supporting a substrate within a process reactor. The wafer holder includes a central portion with an upper surface and a plurality of spacers projecting a uniform height above the upper surface. The spacers are distributed to peripherally support the substrate above the upper surface. The holder also includes a fringe portion, including a ring inner wall extending upwardly from and surrounding the upper surface. The ring inner wall and the upper surface of the central portion thus together define a substrate pocket for accommodating the substrate. The peripheral location of the spacers minimizes any risk of thermal disturbance from the discrete spacer contact with the substrate being processed.

In accordance with another aspect of the present invention, a semiconductor reactor is provided for treating a substrate. The reactor includes a reaction chamber, a plurality of heat sources, and a self-centering single-wafer support structure. The support structure is self-centering in the sense that it is centered and level at a first temperature as well as at a second, different temperature. The support structure includes a wafer holder for directly supporting the substrate, characterized by a first coefficient of thermal expansion. At least one recess is formed in a bottom surface of the wafer holder. The support structure also includes a support spider for supporting the wafer holder, characterized by a second coefficient of thermal expansion different from the first coefficient. The spider includes at least three support posts cooperating with the recess of the wafer holder.

In one embodiment, the support posts cooperate with three radial grooves formed in the bottom of the wafer holder, distributed at 60° intervals. In accordance with this embodiment, the wafer holder remains centered on the spider at any given temperature, despite differential thermal expansion of the holder relative to the spider. In another embodiment, each support post includes a hot-centering surface and a cold-centering surface. At high temperatures, the hot-centering surfaces of at least three support posts define a restrictive circle outside the peripheral edge of a base plate of the wafer holder. At low temperatures, the cold-centering surfaces of at least three support posts define a restrictive circle inside of the inner wall of a peripheral ring of the wafer holder.

In accordance with another aspect of the present invention, a low mass wafer holder is provided for supporting a single substrate in a processing chamber. The wafer holder includes a disc-shaped base plate and an annular ring independent of the base plate. The holder also includes an annular hanging portion integral with either the ring or the base plate, characterized by an inner diameter, and an annular supporting portion integral with the other of the ring and the base plate, characterized by an outer diameter smaller than the inner diameter of the hanging portion. The supporting portion underlies and supports the hanging portion. The two-piece wafer holder design has been found to alleviate stresses associated with thermal transfer for low mass wafer holders.

In accordance with another aspect of the present invention, a semiconductor reactor includes a reaction chamber, a plurality of heat sources, and a wafer support structure for supporting a wafer. The wafer support structure includes a low mass wafer holder, which directly supports the wafer. A temperature sensor, connected to at least one of the heat sources, senses the temperature at a point vertically spaced from the wafer holder. In one embodiment, a thermocouple is spaced below the wafer holder within a spacing range wherein the temperature reading is relatively insensitive to spacing changes. The wafer temperature can thereby be indirectly controlled at an appropriate temperature without regard to spacing changes caused by thermal expansion and other typical factors.

In accordance with another aspect of the present invention, a low mass wafer holder is provided for supporting a single substrate in a processing chamber. The wafer holder includes an upper support surface with a plurality of open radial channels. Each of the channels has a width less than the thermal diffusion length in the substrate (e.g., less than about 5 mm for a silicon substrate). The total volume of the channels is sufficient to permit lifting the substrate independently from the wafer holder. As the wafer is lifted, gas is permitted to flow beneath the wafer, such that no vacuum effect takes place and the wafer is easily separated from the wafer holder.

In accordance with another aspect of the present invention, a wafer holder is provided for supporting a substrate. The wafer holder has a thermal mass less than about five times the thermal mass of the substrate. The holder includes a base plate extending generally parallel with and spaced below the substrate. An annular lip peripherally supports the substrate above the base plate, and includes an inner face which defines a gap between the substrate and the base plate. A gas passage communicates from an underside of the wafer holder to the gap between the substrate and the base plate.

BRIEF DESCRIPTION OF THE DRAWINGS

Further features and advantages of the present invention will become apparent from the detailed description of preferred embodiments which follow, when considered together with the attached drawings, which are intended to illustrate and not to limit the invention, and wherein:

FIG. 2A is a partial, schematic sectional view of the wafer and support structure of FIG. 1;

FIG. 2B is a partial, schematic elevational end view, taken along line 2B—2B of FIG. 2A;

FIG. 4 is a top plan view of the wafer holder of FIG. 1;

FIG. 5 is a partial enlarged view of a lip on the wafer holder of FIG. 5;

FIG. 6 is a partial elevational cross-section, taken along lines 6—6 of FIG. 4;

FIG. 7 is a partial elevational cross-section, taken along lines 7—7 of FIG. 6;

FIG. 11 is a top plan view of the spider of FIG. 1;

FIG. 12 is an elevational cross-section, taken along lines 12—12 of FIG. 11;

FIG. 13 is an enlarged elevational view of a round-tipped post of the spider of FIG. 11;

FIG. 14 is a partial enlarged view of a central portion of the wafer and support structure of FIG. 1, showing a center thermocouple spaced below the wafer holder;

FIG. 19 is a partial elevational cross-section, taken along lines 19—19 of FIG. 17;

FIG. 20 is a partial elevational cross-section, taken along lines 20—20 of FIG. 19;

FIG. 21 is a bottom plan view of the support ring of FIG. 16;

FIG. 24 is a bottom plan view of a base plate of the support structure of FIG. 16;

FIG. 25 is a partial section view, taken along lines 25—25 of FIG. 24;

FIG. 35 is a partial schematic sectional view of a wafer and base plate supported upon the support ring of FIG. 33;

FIG. 36 is a partial schematic sectional view of a wafer holder constructed in accordance with a sixth preferred embodiment of the present invention;

FIG. 37 is a partial schematic sectional view of a wafer holder constructed in accordance with a seventh preferred embodiment of the present invention;

DETAILED DESCRIPTION OF THE PREFERRED EMBODIMENT

Exemplary System

Figure 1:
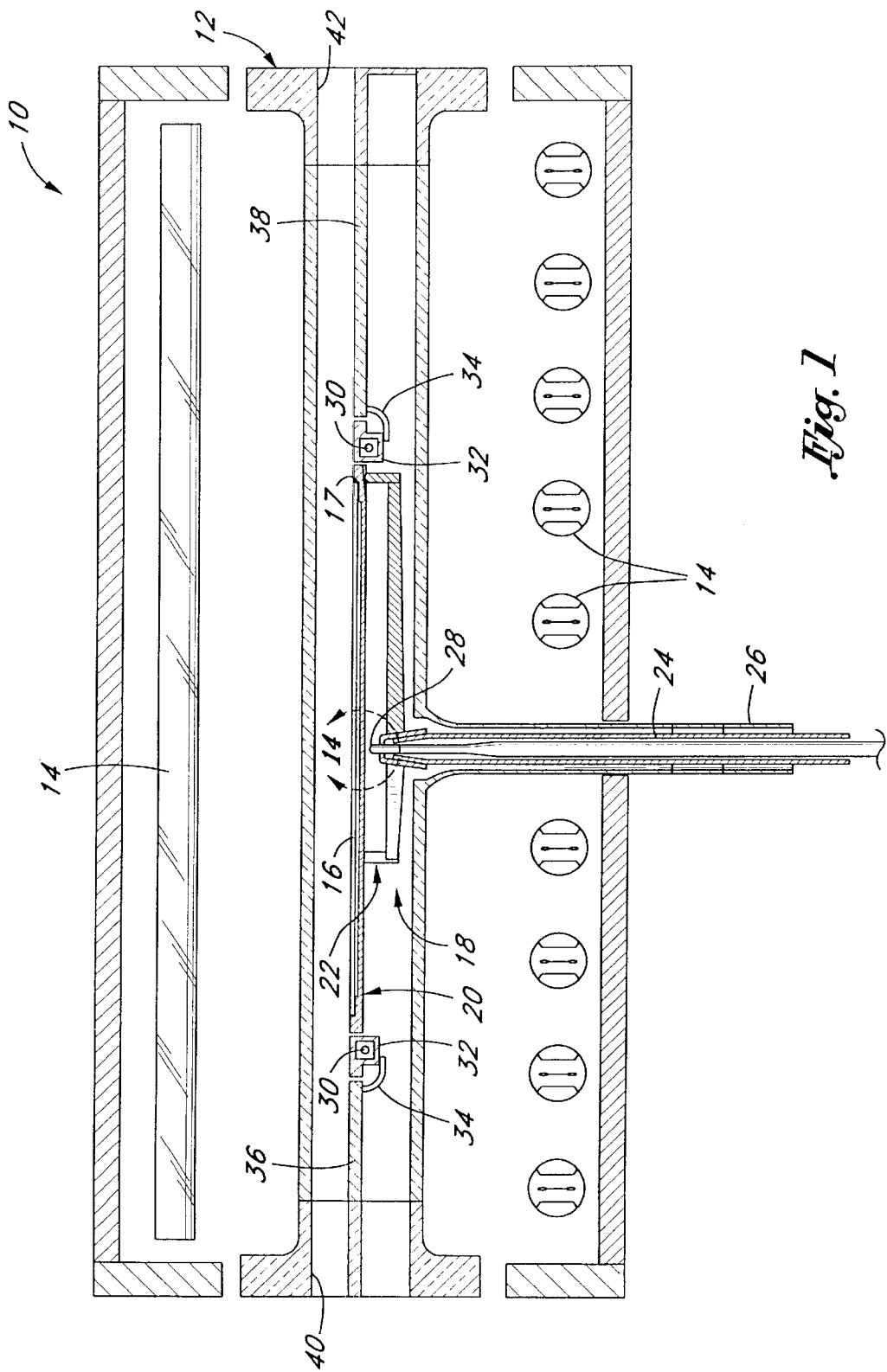
FIG. 1 is a schematic sectional view of an exemplary reaction chamber with a wafer supported therein by a support structure, including a one-piece wafer holder and a spider, constructed in accordance with a first preferred embodiment of the present invention.

FIG. 1 illustrates an exemplary chemical vapor deposition (CVD) reactor 10, including a quartz reaction chamber 12. Radiant heating elements 14 are supported outside the chamber 12, to provide heat energy to the chamber 12 without appreciable absorption by the quartz chamber 12 walls. While the preferred embodiments are described in the context of a "cold wall" CVD reactor, it will be understood that the wafer support systems described herein will have utility in the context of reactors of other types. In particular, one of skill in the art can find application for the wafer support systems described herein for other semiconductor processing equipment, wherein a wafer is to be supported while being uniformly heated or cooled. Moreover, the term "wafer" support systems described herein can support any of a number of substrates, such as glass, which are to be subjected to treatment in reaction chambers, such as CVD, physical vapor deposition ("PVD"), etching, anneal, dopant diffusion, photolithographic, etc. The wafer supports are of particular utility for supporting substrates during treatment processes at elevated temperatures.

A wafer 16 with a generally annular edge 17 is shown supported within the reaction chamber 12 upon a wafer support structure 18, constructed in accordance with a first preferred embodiment of present invention. The illustrated support structure 18 includes a wafer holder 20, upon which the wafer 16 rests, and a support spider 22. The spider 22 is mounted to a shaft 24, which extends downwardly through a tube 26 depending from the chamber 12 lower wall.

A central temperature sensor or thermocouple 28 desirably mounts upon the spider 22 in proximity to the wafer holder 20. Additional peripheral thermocouples 30 are also shown, housed within a slip ring 32 which surrounds the wafer holder 20 and wafer 16. The thermocouples 28, 30 are connected to a temperature controller (not shown), which sets the power of the various heating elements 14 in response to the readings of the thermocouples 28, 30.

In addition to housing the thermocouples 30, the slip ring 32 absorbs radiant heat during high temperature processing. This compensates for a tendency toward greater heat loss at wafer edges 17, a phenomenon which is known to occur due to a greater concentration of surface area for a given volume near such edges. By minimizing edge losses and the attending radial temperature non-uniformities across the wafer 16, the slip ring 32 can prevent wafer crystallographic slip. The slip ring 32 can be suspended by any suitable means. For example, the illustrated slip ring 32 rests upon elbows 34 which depend from a front chamber divider 36 and a rear chamber divider 38. The dividers 36, 38 desirably are formed of quartz.

The illustrated reaction chamber 12 includes an inlet port 40 for the injection of reactant and carrier gases. An outlet port 42 is on the opposite side of the chamber 12, with the wafer support structure 18 positioned between the inlet 40 and outlet 42.

Low Mass Wafer Holders

The wafer holders described herein are "low mass" wafer holders in the sense that they have a thermal mass, as defined in the "Background" section above, comparable to that of the substrate to be supported, such that the temperatures of the wafer and wafer holder can change fairly quickly during heating and cooling processes. Preferably, the thermal mass of the wafer holder is less than about five times, more preferably less than about three times, and particularly between about 0.5 and two times the thermal mass of the substrate. The illustrated wafer holder 20 has a thermal mass about 1.7 times the thermal mass of the 200 mm wafer 16 shown. It will be understood that such thermal mass ratios can be approximately maintained for wafer holders for supporting wafers of other sizes.

The wafer holder 20 may comprise any of a number of suitable materials of consistent density, such as have been utilized in the past for susceptors. As the low mass holder 20 will generally be thin, however, a material exhibiting high strength is desirable. In particular, silicon carbide (SiC) is a preferred material which exhibits high strength, the ability to withstand high temperature cycling and typical CVD process gases, and can be provided with consistent density for uniform thermal properties. The purity with which a thin SiC wafer holder can be provided is also advantageous in preventing contamination of the reaction chamber 12 through normal use.

Single Piece Wafer Holder

FIGS. 2A and 2B schematically show a peripheral portion of the wafer 16 and wafer support structure 18. The wafer holder 20 of the first preferred embodiment comprises a central base plate 50 integrally connected to a peripheral ring 52. The ring 52 is defined by an inner wall 54, extending vertically from above a top surface 56 of the base plate 50, and an outer wall 58, and an upper surface 60 extending between the inner and outer walls. A bottom surface of the ring 52 includes a plurality of recesses 62 (one shown), preferably three, each of which cooperates with a spider post 64 for coupling the wafer holder 20 with the spider 22.

The wafer holder 20 further includes at least one and preferably a plurality of spacers or lips 66 (one shown) which directly support the wafer 16 upon the wafer holder 20. While one or two lips of adequate width can provide adequate support, such as the one continuous lip shown the embodiments of FIGS. 33–37 below, the wafer holder 20 preferably includes 3 to 12 lips. More preferably 6 to 9 lips 66, and particularly six, are desirable for 200 mm wafers. For 300 mm wafer support, 9 or more lips 66 are preferred, and at least one additional support (not shown) should be more centrally located (e.g., within about 50 mm of the wafer center) to counter the effect of gravity on the more massive wafer. The height of the lips 66 define a gap between the wafer 16 and the base plate 50.

As noted in the "Background" section above, a low mass wafer holder tends to stick to the wafer during wafer pick-up after a processing step. This can be a problem for any pick-up device which lifts the wafer. For example, U.S. Pat. No. 4,846,102 describes a pick-up wand which shoots high velocity streams of gas at angles. When brought close to the top of a wafer surface, the gas streams create a low pressure zone above the wafer, causing the wafer to lift. The disclosure of U.S. Pat. No. 4,846,102 is hereby incorporated by reference. If the entire wafer bottom surface contacts a low mass wafer holder, a vacuum effect causes the wafer holder initially to lift along with wafer, then later dropping in an uncontrolled fashion.

The gap created by the preferred spacers or lips 66 can alleviate this concern by permitting gas to flow between the wafer 16 and the holder 20, thereby reducing the vacuum effect which can cause inadvertent lifting of the low mass wafer holder 20. The copending U.S. patent application Ser. No. 08/621,627, filed Mar. 26, 1996, entitled LOW MASS SUSCEPTOR, discloses a low mass wafer holder including a gap to facilitate wafer pick-up. The disclosure of this application is hereby expressly incorporated by reference. In that application, the spacers comprise separate pins which fit into recesses on the top surface of the wafer holder, distributed at points below the wafer.

As also noted in the "Background" section, introducing a cold wafer to a pre-heated susceptor or wafer holder can cause thermal shock to the wafer holder and/or wafer. The gap can also address this concern by slowing the transfer of heat from a hot wafer holder to a cold wafer.

Figure 3:
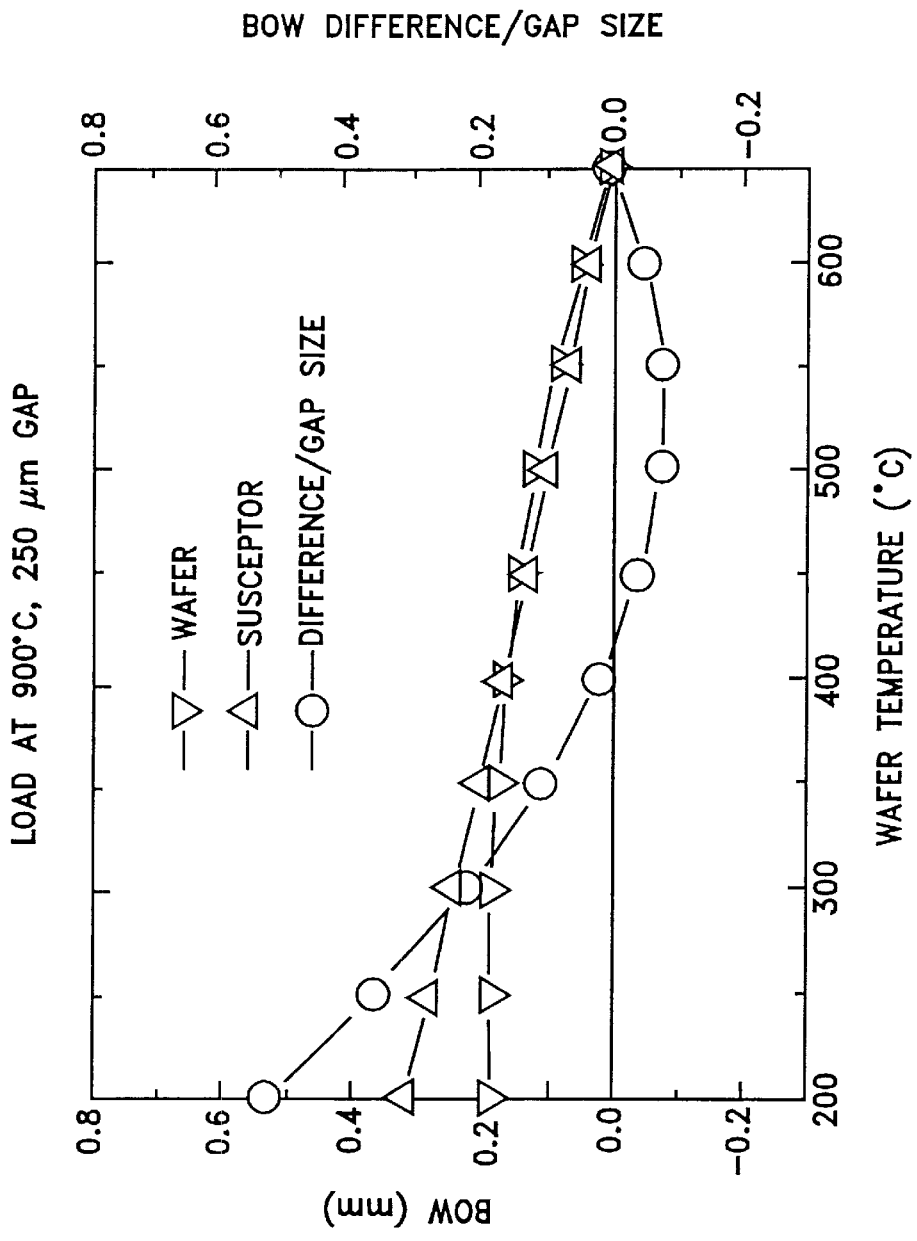
FIG. 3 is a graph illustrating bowing of the wafer holder and wafer from cold wafer placement on a hot wafer holder.

FIG. 3 illustrates, however, that the presence of a gap does not altogether alleviate the problem of bowing. FIG. 3 shows wafer and wafer holder bowing, as a function of the wafer temperature, for a wafer at 200° C. placed upon a disk-shaped wafer holder, of the same diameter as the wafer, at 900° C. with a 250 micron ($250 \times 10^{-6}$ m) gap.

Immediately after the cold wafer is dropped upon the hot wafer holder, the temperature differential is at its greatest, as is the rate of heat exchange. Vertical thermal gradients are created across the susceptor and the wafer, causing both to bow down in the center to different degrees. The size of the gap thus changes, as also indicated upon the graphs of FIG. 3. Furthermore, the gap change is greatest at the center of the wafer and least at the wafer edges 17. Accordingly, differential bowing can also cause lateral thermal gradients. Lateral thermal gradients are also induced when the wafer holder is larger in diameter than the wafer.

Table I shows that the wafer and wafer holder bow as a function of various factors. The columns list, in order: the temperature at which the wafer holder is upon cold drop-off, known as the "load temperature" of the wafer holder; the thickness of the portion of the wafer holder below the wafer; the size of the initial gap for various experimental arrangements; a time constant indicating the speed of the heat exchange between the wafer and the wafer holder (particularly, the time required to reach 63% of the total temperature change which occurs after cold wafer drop-off); the stress experienced by the wafer holder during the heat exchange; the degree of bowing experienced by the wafer holder; and the difference between bowing of the wafer and the wafer holder, given as a percentage of the initial gap.

TABLE 1

| Load temp. (° C.) | Plate Thickness ($\mu$m) | Gap ($\mu$m) | Time Constant (s) | Stress ($10^7$ N/m$^2$) | Plate Bow (mm) | Bow Difference (% of Gap) |
|---|---|---|---|---|---|---|
| 700 | 725 | 500 | 1.38 | 0.27 | 0.09 | 5 |
| 700 | 725 | 250 | 0.69 | 0.55 | 0.17 | 20 |
| 500 | 725 | 250 | 0.77 | 0.23 | 0.07 | 2 |
| 900 | 400 | 250 | 0.49 | 0.56 | 0.32 | 53 |
| 900 | 200 | 250 | 0.32 | 0.28 | 0.32 | 53 |
| 900 | 725 | 250 | 0.63 | 1.00 | 0.32 | 53 |
| 900 | 725 | 500 | 1.26 | 0.51 | 0.16 | 13 |
| 900 | 725 | 100 | 0.25 | 2.60 | 0.80 | 331 |
| 900 | 725 | 50 | 0.13 | 5.10 | 1.60 | 1324 |

As will be understood from Table I, a higher load temperature leads to a greater difference in bowing. Similarly, the thickness of the wafer holder and the size of the gap also affect the degree of stress and bow experienced. For a constant gap size, increasing thickness of the wafer holder slows achievement of thermal equilibrium but increases the stress upon the wafer holder, due to larger vertical thermal gradients. Increasing the size of the gap between the wafer and the wafer holder slows the heat exchange, as indicated by the time constant. This tempering of the heat exchange reduces thermal gradients, thereby reducing the stress upon the wafer holder. The bow difference, as a percentage of the gap, also decreases with increasing initial gap.

It will be understood that bowing of the preferred wafer holder will be different from that shown in Table I, because of its non-planar shape and lateral temperature gradients. The general relationship between bow and gap, however, remains true for the preferred wafer holder 20.

While Table I indicates that a large gap is beneficial for reducing stress during cold wafer drop-off, too large a gap can be disadvantageous for heating and cooling the wafer and holder together. For this consideration, a small gap is advantageous for thermally coupling the wafer and wafer holder. If the gap is too large and the wafer and wafer holder become uncoupled, the wafer temperature will not necessarily be close to the susceptor temperature and it will be difficult to control uniformity. As with wafer drop-off, thermal transients induce stress which can lead to stress-induced defects in the wafer, commonly referred to as crystallographic "slip."

Spacing Lips

FIGS. 4 to 10 illustrate an exemplary wafer holder 20 in accordance with the first preferred embodiment, constructed to accommodate the above-noted and other considerations. It should be noted, however, that the wafer holder 20 of FIGS. 4 to 10 is merely an example of a wafer holder within the scope of the present invention.

Along with the base plate 50, the inner wall 54 of the ring 52 defines a wafer pocket for receiving the wafer 16 (FIGS. 1 and 2) to be processed. The diameter of the inner wall 54 is thus slightly larger than the wafer 16 diameter, or about 7.970 inch (202.44 mm) for a 200 mm wafer 16. A chamfer 70, angled at about 45° to each of the ring top surface 60 and the inner wall 54, reduces the risk of injury to technicians in handling the wafer 16.

In order to provide the advantages of a low mass wafer holder, the thickness of the base plate 50 is desirably close to that of the wafer 16 to be processed. Accordingly, the base plate 50 preferably has a thickness between about 0.005 and 0.070 inch, and more preferably between about 0.010 and 0.040 inch. Typical 200 mm wafers have a thickness of about 0.029 inch. The base plate 50 of a wafer holder 20 designed to hold a 200 mm wafer is thus between about 0.025 and 0.032 inch. The illustrated base plate 50 has a thickness of about 0.0285 inch. In contrast, a wafer holder 20 designed for receiving a 300 mm wafer desirably has a base plate 50 thickness of about 0.0305 inch. It will be understood that the thickness will be otherwise to maintain the desired thermal mass ratio for wafers of other sizes.

The thickness of the peripheral ring 52, as measured by the length of the outer wall 58, can be approximately equal to or greater than the thickness of the base plate 50, as shown. Preferably, the peripheral portion of the wafer holder 20 is between about 1.2 and 3.0 times as thick as the base plate 50, and more preferably the ring 52 is about 2 times as thick as the base plate. For the illustrated embodiment, the ring 52 has a thickness of about 0.077 inch, whereas the base plate 50 has a thickness of about 0.0285. The greater mass of the peripheral ring 52 balances the normal tendency for the temperature at edges of the wafer holder 20 to lead the central portion of the base plate 50 during temperature changes. The ring 52 thus complements the edge loss compensation function performed by the slip ring 32 (FIG. 1), at least to some extent.

Lip Height

As noted with respect to schematic FIG. 2, the wafer holder 20 also includes a plurality of lips 66 to space the wafer 16 above the base plate 50. The height of the lips 66 is chosen to optimally promote heat coupling between the wafer 16 and the wafer holder 20, while still maintaining an adequate distance to minimize thermal shock upon wafer drop-off. It has been determined that the height of the lips 66 should be such as to permit a bow difference of no more than about 20% of the gap height upon introduction of a cold wafer to a hot wafer holder. In addition to promoting heat coupling and minimizing thermal shock, the gap aids in separately picking up the wafer without the holder 20 sticking to the wafer, when lifting with a pick-up device which lifts the wafer 16 from above or from its edges 17.

In accordance with these guidelines, and considering the material and dimensions of the preferred wafer holder 20, the lips 66 preferably extend above the base plate 50 a height of between about 0.005 and 0.080 inch, and more preferably between about 0.010 and 0.030 inch for processing 200 mm wafers. For 300 mm wafers, a lip 66 height of about 0.015 to 0.050 inch is preferred, more preferably about 0.025 to 0.035 inch. The lips 66 of the illustrated embodiment are about 0.020 inch (about 500 microns) high. When the wafer 16 (FIGS. 1 and 2) rests upon the lips 66, a gap of 0.020 inch is thus created between the wafer 16 and the base plate 50.

Integral Lips

Desirably, the lips 66 are integrally formed as one piece with the surfaces of the wafer holder 20 from which they extend. In the illustrated embodiment, the ring 52, base plate 50 and lips 66 can all be machined from a single piece of silicon carbide. Fewer pieces are thus subject to loss during ordinary handling of the wafer holder 20 by the end user, as compared to separate support structures inserted into holes or recesses in a wafer holder. Also, integral spacers can not be lifted out of the wafer holder, unlike separate support structures, when a wafer is unloaded from the holder after processing.

Perhaps more significantly, the lips 66 can be machined to a precisely uniform height. The wafer 16 is thereby evenly supported at a constant gap with the base plate 50 across the entire wafer surface. As will be understood by one of skill in the art, the uniform gap facilitates uniform thermal properties during processing at steady temperatures, as well as during temperature transitions.

An adequate number of lips 66 are provided and distributed to support the wafer 16. Thus, at least three lips 66 are provided. In the illustrated embodiment, designed to hold a 200 mm wafer 16, six lips 66 are shown circumferentially distributed at 60° intervals. For such an arrangement, a wafer of the type having a flat section for alignment purposes will be supported by at least three lips 66, and more likely by five lips 66, even if the flat is aligned with one of the lips 66.

Peripheral Lips

As shown, the lips 66 are advantageously positioned to peripherally support the wafer 16. Accordingly, the lips 66 extend radially inward from the ring inner wall 54 a distance adequate to ensure that each of the lips 66 extend below the wafer 16 even if the wafer is not perfectly centered within the wafer pocket.

The term "peripheral," as used to describe the lips 66, indicates that the lips do not extend more than about 5 mm inward of the wafer edge 17 when supporting a wafer 16, preferably extending from beyond the wafer edge 17 to less than about 3 mm inside the wafer edge 17. The illustrated lips 66 each extend about 0.125 inch (3.21 mm) from the inner wall 54 to an inner lip face 72. Thus, a circle 74 (FIG. 4) defined by the lip faces 72 of the illustrated lips 66 has diameter of about 196 mm (7.720 inches), or slightly smaller than the diameter of the 200 mm wafer 16 to be supported. With the wafer 16 properly centered upon the wafer holder 20, each lip extends only about 2.0 mm beneath the wafer 16.

Providing the support peripherally, however, advantageously tends to bring the support locations within the peripheral wafer exclusion zones (in which no devices are fabricated) of most manufacturers. As the exclusion zone of a 200 mm wafer is typically about 3 mm (0.12 inch), the lips 66 preferably extend less than this distance beneath the wafer 16 for typical wafer centering on the holder. Thus, any defects to the wafer 16 introduced by contact with the lips 66 are in a less critical area of the wafer 16. Secondly, confining support locations to the periphery presents a confined peripheral area in which to scan the wafer for crystallographic slip or other damage which can be caused by temperature non-uniformities.

Furthermore, as discussed above, vertical thermal gradients during ordinary processing, and consequent radial thermal gradients, tend to cause bowing of the wafer 16. A centrally supported wafer would curl upward at its edges. Such upward curling could scratch or otherwise damage the pick-up device or the wafer. The peripherally supported wafer 16, on the other hand, accommodates any wafer bowing in a central gap above the base plate 50.

Desirably, the lips 66 have a smooth upper surface finish such as to prevent backside damage to the wafer 16. The upper surface of the lips 66 preferably has a roughness of less than about 16 Ra, and more preferably less than about 8 Ra.

Width of Lips

Though peripherally located, preferably below the exclusion zone of the wafer 16 (FIG. 2), the lips 66 should also be of small enough dimension to have negligible thermal effects upon the wafer 16 during processing. At least one dimension of the lip surface contacting the wafer 16 is thus preferably less than the thermal diffusion length in the material of the substrate to be processed. The thermal diffusion length is a measure of how far heat diffuses into a material in a given period of time. More particularly, thermal diffusion length is giver by the following formula:

$$L^2 = \frac{\lambda \tau}{C_p \rho}$$

where:
$\lambda$=the heat conductivity of the material
$\tau$=is a characteristic time constant,
$C_p$=the specific heat (heat capacity) of the solid, and
$\rho$=the density of the solid.

Taking $\tau$=0.55, the 63% equilibration time for holder-wafer heat exchange, the diffusion length for silicon can be calculated as about 5 mm.

Preferably, therefore, at least one dimension of the contacting surface of each lip 66 is less than about 5 mm, more preferably less than about 3 mm, and most preferably less than about 1.5 mm.

More preferably, both dimensions of the lip surface contacting the wafer 16 in the supported position (see FIG. 2) are less than the thermal diffusion length in silicon. The thermal effect of such small contacting surfaces is thus quickly averaged out, such that the no appreciable thermal gradients are created, even if the wafer holder 20 has a slightly different temperature than the wafer 16.

Therefore, each lip 66 has a width less than about 5 mm near the inner face 72 (see FIG. 5). Preferably, the width of each lip 66 is between about 0.25 and 2.5 mm, more preferably about 0.5 and 1.5 mm, to provide stability for supporting the wafers while minimizing any disturbance to the wafer's thermal properties. The illustrated embodiment provides a lip width of about 0.0285 inch (0.73 mm) at the lip inner face 72. As noted above, the length of each lip 66 (measured radially) is about 0.125 inch (3.2 mm), of which only about 2.0 nmm extends below a properly centered wafer 16. Accordingly, both dimensions of the supporting surface of each lip 66 are less than the thermal diffusion length in silicon.

Curved Features

As seen from the views of FIGS. 5–7, the lips 66 include several curved surfaces in transition from the integral lip 66 to the remainder of the wafer holder 20. These curved surfaces provide increased strength to the lips 66, such as to resist breaking off during handling, wafer drop-off or wafer pick-up. For example, as best seen from the view of FIG. 5, the illustrated lips 66 flare outwardly near the ring inner wall 54. The flare follows a radius of curvature between about 0.05 and 0.09 inch, preferably about 0.07 inch. This curvature particularly facilitates machining the preferred silicon carbide material. The width of the lip 66 at its juncture with the wall is thus about 0.11 inch (2.92 mm). As this base lip width remains less than the thermal diffusion length in silicon, the lips 66 will cause minimal thermal disturbance even for wafers which are not perfectly centered within the holder 20. Similarly, FIG. 6 shows curved surfaces in transition between the ring inner wall 54 and the top surface of the lip 66, and between the lip inner face 72 and the top surface 56 of the base plate 50. These rounded corners have a radius of curvature around 0.010 inch, and extend all around the corners joining the illustrated lips 66 with the remainder of the wafer holder 20. In addition to providing strength to the small structures of the wafer holder 20, the illustrated curvature avoids sharp corners which can cause thermal and structural stresses.

While the preferred wafer holder 20 is designed for supporting a 200 mm wafer, one of ordinary skill in the art can readily adapt the teachings of the present disclosure to determine the appropriate dimensions for supporting for larger future generation wafers. For supporting a 300 mm wafer, for example, it is desirable to provide a larger gap than that for a 200 mm wafer. Preferably, the gap for a 300 mm wafer is between about 0.025 and 0.035 inch. It will additionally be understood that for larger wafers, a greater number of lips may be required to support a larger wafer without sagging in the center. Bumps or equivalent structures can also be provided in positions closer to the center of the wafer holder to support larger wafers and maintain constant separation between the wafer and the wafer holder.

Self-Centering Support System

Figure 8:
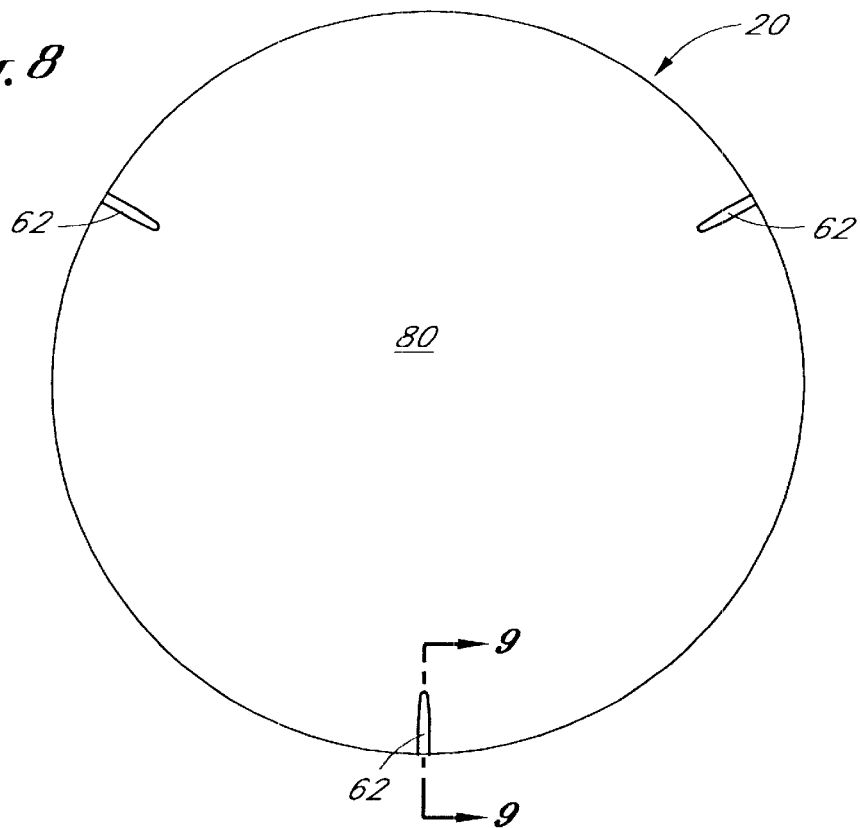
FIG. 8 is a bottom plan view of the wafer holder of FIG. 1.
Figure 9:
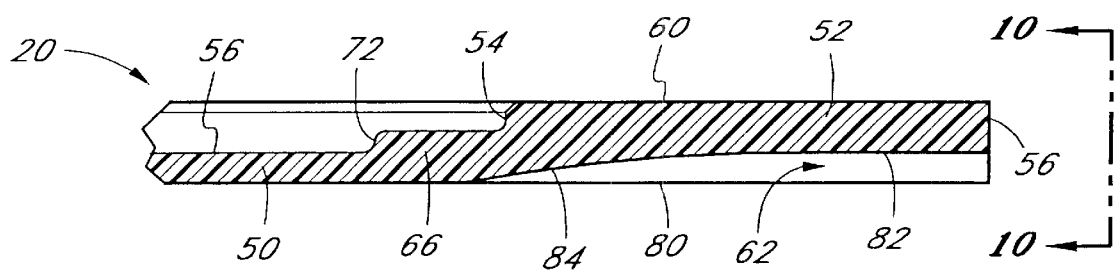
FIG. 9 is a partial elevational cross-section, taken along lines 9—9 of FIG. 8.
Figure 10:
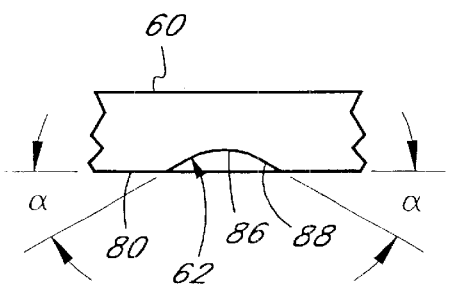
FIG. 10 is a partial elevational cross-section, taken along lines 10—10 of FIG. 9.

FIGS. 8–10 illustrate the plurality of recesses 62 distributed about a bottom surface 80 of the wafer holder 20. As briefly noted with respect to FIG. 2, each of the recesses 62 cooperates with a spider post 64 for coupling the wafer holder 20 with the spider 22 (FIGS. 11–13). Accordingly, the number of recesses 62 formed in the wafer holder 20 is desirably the same as the number of posts 64 of the spider 22 (FIG. 11–13). In the illustrated embodiment, three recesses 62 are formed in the bottom surface 80 of the wafer holder 20, desirably even spaced at intervals of 120°, matching the spacing of the spider posts 64 (FIGS. 11–13) for centering the wafer holder 20 on the spider 22.

While each recess 62 is illustrated as aligned with one of the six lips 62 on the upper surface of the wafer holder 20 (see FIG. 9), it will be understood that this alignment is not critical. Similarly, while each recess 62 is illustrated as extending peripherally to the outer wall 58, it will be understood that this position is not critical and is merely convenient from the standpoint of machining the recesses 62. Desirably, however, the recesses 62 are each located the same radial distance from the center of the preferred circular wafer holder 20.

Preferably, each recess 62 includes a level section 82, which is machined to a consistent depth for a pre-selected radial distance from the wafer holder 20 perimeter, thus running generally parallel to the major base plate surfaces (top and bottom). The pre-selected distance should be greater than the degree of relative movement between the wafer holder 20 and the spider 22 (FIGS. 11–13) caused by differential thermal expansion, as will be understood from the description of the recess centering function below. For the illustrated materials and dimensions, such relative movement will generally be less than about 0.025 inch. The radial length of the level section 82 is thus greater than about 0.025 inch, and is about 0.145 inch in radial length for the illustrated level section 82.

Radially inward of the level section 82 is a tapered section 84, which becomes more shallow in the direction of the center of the wafer holder 20. In the illustrated embodiment, the tapered section 84 conforms to a curvature of radius 1.40 to 1.50 inches. Advantageously, the tapering avoids sharp corners and attendant thermal stresses and facilitates manufacturing.

FIG. 10 shows a profile of the illustrated recess 62. Preferably, the recess 62 includes a rounded trough portion 86, as shown, extending into a flat 88 in either circumferential direction. Thus, in the end view of FIG. 10, the recess 62 resembles a "V" shape. Each flat 88 defines an angle α with the bottom surface 80 of the wafer holder 20. In the illustrated embodiment, the trough conforms to a curvature of radius 0.050–0.070 inch, and angle α is about 29°–31°. The deepest portion of the trough 86, within the level section 82, is about 0.0285 inch for the illustrated embodiment.

While the illustrated flats 88 are approximately planar, it will be understood in light of the interaction described below that the flats can have curvature. Preferably, the curvature does not exactly match that of the ball-end post 64 (described below) with which the recess 62 is to interact. More preferably, any curvature of the flat 88 is "flatter," or of higher radius, than that of the ball-end post 64.

Spider

FIGS. 11–13 illustrate the preferred spider 22. As noted, the recesses 62 in the bottom surface 80 of the wafer holder 20 are designed to interact with posts 64 of the spider 22. The spider 22 includes a central hub 90 and a plurality of arms 92 extending radially from the hub 90. Preferably, the spider 22 includes three evenly spaced arms 92 (i.e., at 120° intervals) of equal length. The arms 92 terminate at posts 64, one of which was schematically depicted in FIG. 2. Desirably, the posts 64 define a cylinder of radius slightly larger than the wafer 16 to be supported, indicated in phantom in FIG. 11. The spider 22 preferably comprises a material transparent to the radiation of the heat elements 14 (FIG. 1). The illustrate spider 22 comprises quartz, which is both a radiation-transparent material and capable of withstanding repeated extreme heat cycling.

With reference to FIG. 12, the hub 90 is hollow and includes an upper flange 94, a cylindrical portion 96 extending below the flange 94, and a conical portion 98 widening the hub 90 below the cylindrical portion 96. The conical portion 98 engages with the hollow shaft 24 (FIG. 1), though it will be understood that the hub could be integral with the shaft in other arrangements. The center thermocouple 28 and wiring therefor extends through the shaft 24, the hub 90, and upward through the opening defined by the flange 94. The center thermocouple 28 is illustrated and discussed in more detail with respect to FIGS. 14 and 15.

The arms 92 extend radially outward from the cylindrical portion 96 of the hub 90, generally horizontal and parallel with the wafer 16 in the properly mounted position (see FIG. 1). Desirably, the thickness of each arm tapers radially outward. For example, the illustrated arm 92 has a thickness of about 0.40 inch near the hub, tapering to about 0.25 inch at the post. The posts 64 extend vertically upward from the radial terminus of each arm 92, a vertical length of 0.44 inch for the illustrated embodiment.

It will be understood that in other arrangements the spider arms can extend upwardly at an angle and still arrive at the same point as the horizontal arm and the vertical post. Even for such arrangements, however, it is advantageous to have at least a short vertical post at the terminus of the arm, as will be understood from a description of the ball-end of the preferred post 64 and its function.

As best seen from FIG. 13, each post 64 terminates in a ball-end or rounded surface 100. The ball-end surface 100 is characterized by a size and curvature which is selected to fit within one of the recesses 62 in the wafer holder 20 (see FIGS. 8–10). For example, the illustrated ball-end surface 100 includes a central spherical section having a radius of curvature of about 0.09–0.11 inch and the width of the post 62 is about 0.157 inch. Radially outward of the central spherical section, the ball-end surface 100 also includes an annular conical section 101 which forms an angle β with the horizontal. The angle β is preferably greater than the angle α formed by the flats 88 (FIG. 10) within the wafer holder recesses 62.

It will be understood that, for other arrangements, the ball-end surface can follow a curvature other than spherical (e.g., toroidal, elliptical, completely conical, pyramid-shaped, etc.). Desirably, however, the curvature is symmetrical in at least one dimension, for centering. While a vertical post section is advantageous in facilitating such symmetry, it will be understood that such symmetry can be provided in arrangements where the spider merely has arms angled upwardly from the hub.

Referring now to FIGS. 10 and 13 and schematic assembly FIGS. 2A and 2B, the preferred ball-end surface 100 (FIG. 13) is larger than the trough portion 86 (about 0.060 inch) of the recesses 62, but still comes within the wider confines of the recess 62 defined by the flats 88 along each recess 62 (FIG. 10). Accordingly, when assembled (FIGS. 2A and 2B), the spherical ball-end surface 100 of each spider post 64 contacts the flat surfaces 88 of one of the recesses 62 in the wafer holder 20.

During assembly, the radially inward tapered sections 84 (FIG. 9) of the recesses 62 can aid the end user in centering the wafer holder 20 upon the spider 22. Once assembled, however, the ball-end 100 on each post 64 sits within the level section 82 of one of the recesses 62. There are three recesses 62 positioned around the bottom of the wafer holder 20 (preferably peripherally and at 120° to one another—see FIGS. 8 and 11), corresponding to three spider posts 64 similarly positioned relative to the spider hub 90.

When the three ball-end posts 64 are each within one of the three V-shaped recesses 62, the relative position of the spider 22 and the wafer holder 20 is constrained to one degree of freedom. For example, if an external force is exerted which has a tendency to pull one post 64 in the direction along its corresponding recess 62, the outer flats 88 of the other two recesses 62 will exert an equal and opposite force on the other two corresponding ball-end posts 64 through the rounded surface 100. The movement in the direction of the external force is resisted, and the system remains centered. Since the one stable position available is arranged to center and level the wafer holder 20 (by positioning the various elements with radial symmetry), the combination of the ball-end surfaces 100 and the V-shaped recesses 62 is referred to as a self-centering system. The wafer holder 20 is centered relative to the spider 22 and the surrounding reactor parts (e.g., the slip ring 32).

It will be understood that self-centering in a unique position of stability occurs where more than three ball-end posts and V-shaped recesses are employed in a similar manner. Furthermore, one of skill in the art can readily apply the teachings of the present disclosure to reverse the positions of the curved surface and the V-shaped recess. For such an arrangement, each of three or more posts would include a V-shaped recess for cooperating with one of three or more curved surfaces provided on the bottom of the wafer holder.

In operation, the illustrated arrangement maintains a level and self-centered wafer holder 20 even when thermal expansion or contraction changes the dimensions of the wafer holder 20, and even when the wafer holder 20 expands or contracts to a different degree than the spider 22. Differential expansion generally occurs for the preferred materials, that is, for the quartz spider 22 and the SiC wafer holder 20, though it will be understood that such expansion would occur for parts of a variety of other suitable materials.

For example, at high temperatures, the wafer holder 20 will expand and the recesses 62 will move further away from the center of the wafer holder 20 (see FIG. 8). For the preferred wafer holder dimensions and material, the movement may be as high as 0.025 inch. In the meanwhile, the posts 64 of the preferred quartz spider 22 will move relatively little, relative to the hub 90 (see FIG. 11). Due to radial symmetry, the recesses 62 in an assembled wafer support structure 18 (FIGS. 1–2B), will each move radially outward by the same distance on their respective posts 64. At each temperature, there will be only one unique position of stability: the position in which the wafer holder 20 is centered.

Referring again to FIGS. 2A and 2B, the cooperation between the posts 64 and the recesses 62 can additionally impart rotation from the shaft 24 to the wafer holder 20. While the spider 22 may be stationary, it typically mounts to a rotating shaft to impart rotary motion to the wafer holder for enhancing chemical deposition uniformity over the wafer. In the illustrated embodiment, the shaft 24 is mechanically connected to a motor below the reaction chamber 12 (FIG. 1).

Center Thermocouple Spacing

With reference to FIG. 14, the center temperature sensor or thermocouple 28 is shown extending through the spider hub 90, with its tip 110 spaced from the base plate 50. The thermocouple 28 comprises an outer protective sheath surrounding a ceramic support, with a pair of thermocouple wires extending therethrough and forming a junction just below the tip 110.

Desirably, the protective sheath comprises a thermally conductive material which does not devitrify under CVD processing conditions. Preferably, the protective sheath is composed of silicon carbide, though other satisfactory materials include boron nitride, silicon nitride, silicon dioxide, aluminum nitride, aluminum oxide, and various combinations thereof. The illustrated thermocouple 28 further includes a quartz sleeve or cap shielding the protective sheath from the junction, in the event the sheath is not chemically compatible with the thermocouple wires. Alternatively, a boron nitride coating can be used on the wires.

Prior art reactors typically include a center thermocouple to indirectly measure the temperature of the wafer holder, since methods of directly measuring wafer temperature during processing have been found unsatisfactory for a variety of reasons. Prior art wafer holders, however, typically were thick enough to include a recess in which to insert the thermocouple, thereby accurately obtaining a gauge of the wafer holder temperature. The wafer holder, in turn, was the best indicator of the actual wafer temperature. Knowing a relationship between wafer temperature and wafer holder temperature through experimentation, the temperature controller can be calibrated to indirectly control wafer temperature.

The preferred base plate 50, on the other hand, is too thin to provide such a recess. A through hole is undesirable for the illustrated embodiment, as it would tend to induce backside deposition during CVD. Arranging the thermocouple tip 110 to contact the base plate 50 in order to obtain a reading as close as possible to the actual temperature of the wafer holder 20 is also undesirable. Rotation of the wafer holder 20, vibrations, and/or thermal expansion could bring the thermocouple out of contact with the wafer holder 20 in the midst of processing, radically changing the relation thermocouple reading and the wafer temperature. Furthermore, the thermocouple 28 is typically fixed at a point on the order of 30 cm below the tip 110, beneath the reaction chamber 12. The length of the thermocouple 28, including the thermally conductive SiC protective sheath, expands upwardly from the fixed point during thermal processing. This expansion can also cause the thermocouple tip 110 to come into and out of contact with the wafer holder 20, changing the thermocouple calibration, and potentially moving the low mass wafer holder 20 during processing.

Accordingly, the thermocouple 28 is mounted within the spider hub 90 to space the tip 110 a pre-determined distance from the wafer holder 20, as shown. At a minimum, the tip 110 is spaced from the wafer holder 20 such that the two never touch during processing, even during high temperature steps where the upward thermal expansion of the thermocouple is at a maximum. Preferably, the maximum spacing is such that the wafer temperature deviates from the reading it would have if the thermocouple were touching the wafer holder by less than about ±5 C.°, more preferably by less than about ±2 C.°, and most preferably by less than about ±1 C.°. Desirably, the pre-determined spacing between the tip 110 and the wafer holder 20 is chosen within a range wherein the thermocouple/wafer temperature relationship remains fairly spacing insensitive, as will be understood from the following discussion of FIG. 15.

Figure 15:
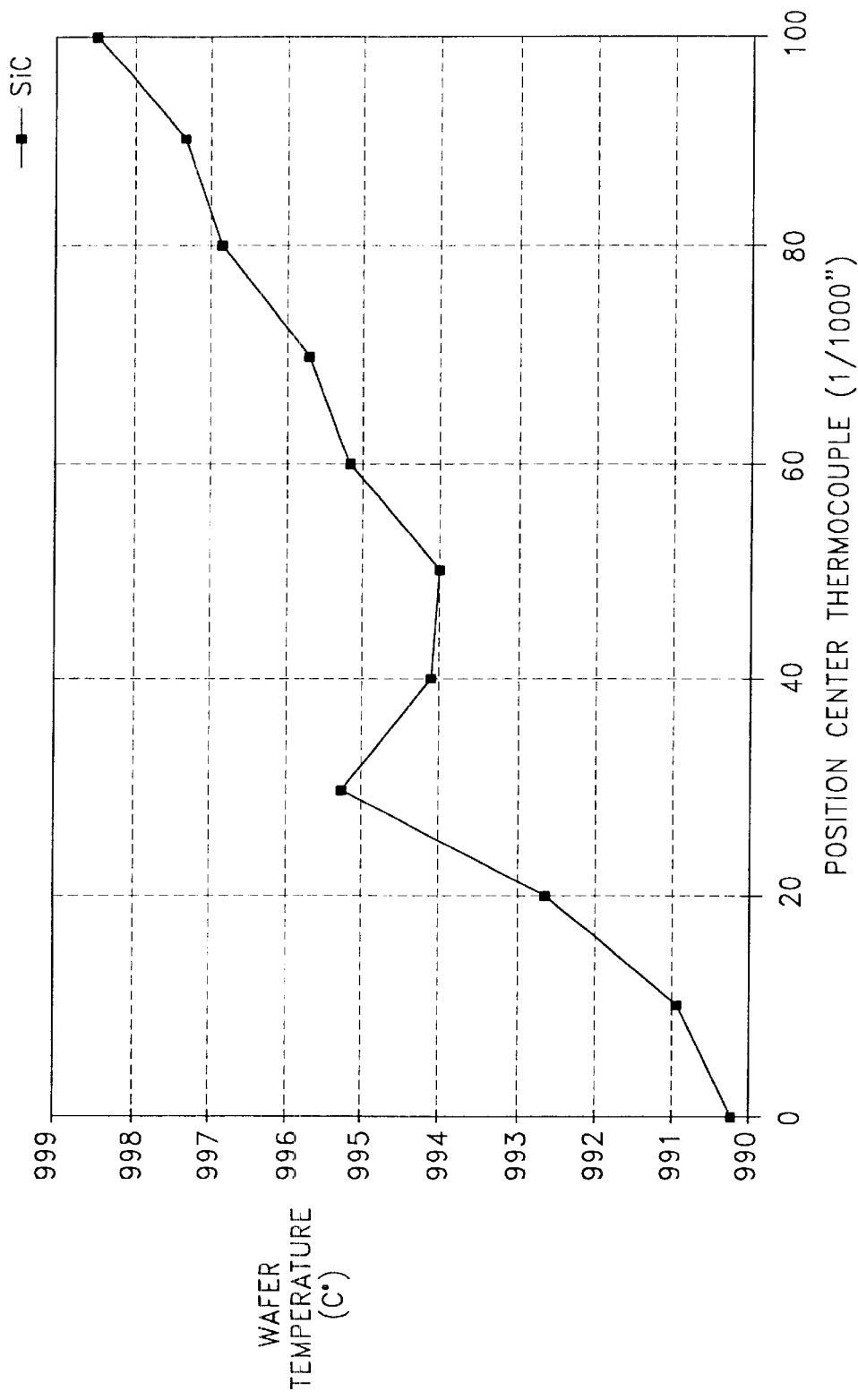
FIG. 15 is a graph plotting temperature readings of a thermocouple against the position of the thermocouple below the wafer holder of FIG. 1.

Referring now to FIG. 15, a graph is shown with wafer temperature on the abscissa and the spacing between the thermocouple 28 and the base plate 50 on the ordinate axis. As in actual reactor operation, a temperature controller connected to radiative heat sources (lamps) for the reactor chamber was used to maintain the center thermocouple 28 temperature fixed at 1000° C. for this experiment. An instrumented wafer supported by the wafer holder 20 was also heated by the heat lamps, and the temperature of the wafer directly measured by the instrumentation in the wafer. As the center thermocouple 28 was moved, the wafer temperature changed, indicating that the relationship between the thermocouple temperature and wafer temperature changes with the distance between the wafer holder 20 and the thermocouple 28.

Between about 0.030 inch and 0.070 inch spacing, however, the curve remains fairly flat, as compared to adjacent sections of the curve. Within this range, the relationship between wafer and thermocouple temperature remains fairly spacing-insensitive. Accordingly, minor spacing fluctuations during processing from the above-noted factors (rotation of the wafer holder 20, vibrations, and/or thermal expansion) result in tolerable changes in the relationship between wafer temperature and thermocouple temperature. Therefore, the preferred wafer support structure 18 is arranged to space the tip 110 of the center thermocouple 28 between about 0.030 and 0.070 inch from base plate 50 of the preferred wafer holder 20. Preferably, the initial spacing is in the midst of this range, about 0.040 and 0.060 inch, such that fluctuations during operation remain within the 0.030 to 0.070 inch range. Most preferably, the initial spacing is set at about 0.050 inch.

One of skill in the art will recognize that the optimal thermocouple-wafer support spacing range may differ for different thermocouple types, and for different wafer support structures. For example, the optimal spacing may depend upon the thermocouple surface area exposed to the wafer holder, the surface area of the wafer holder, the lamp power, and/or other dimensions and materials of the thermocouple. The skilled artisan can adapt the teachings herein, however, to optimize the spacing for any particular system to minimize spacing fluctuation sensitivity, utilizing the above-described experimental techniques.

In particular, the initial spacing is preferably be such that the wafer temperature at steady state changes by less than about 10° C. for a spacing fluctuation of 0.010 inch. In other words, the slope of a wafer temperature versus thermocouple spacing (like FIG. 15) at the initial position of the thermocouple is within about ±10° C./0.010". More preferably, the slope is less within about ±5 C.°/0.010".

Two-Piece Wafer Holder with Supporting Ring

With reference now to FIGS. 16–25, a second preferred embodiment of the present invention is illustrated, wherein the wafer holder 20a comprises a ring 52a and a separate base plate 50a, rather than a single integral piece. The material of the illustrated wafer holder 20a can be the same as that of the previous embodiment, preferably comprising silicon carbide, and the lips 66a are still integral (forming one piece) with one of the ring 52a and base plate 50a. The wafer holder 20a is also preferably of low thermal mass, as described above. As the wafer holder 20a is otherwise substantially similar to the wafer holder 20 of the first preferred embodiment illustrated in FIGS. 1–15 and described above, like reference numerals will be used throughout the remaining description to describe like features. Similar but significantly altered features will be referred to with like reference numerals with the additional suffix "a." Additionally, new features without analogous features in the first embodiment will also carry the suffix "a."

Figure 16:
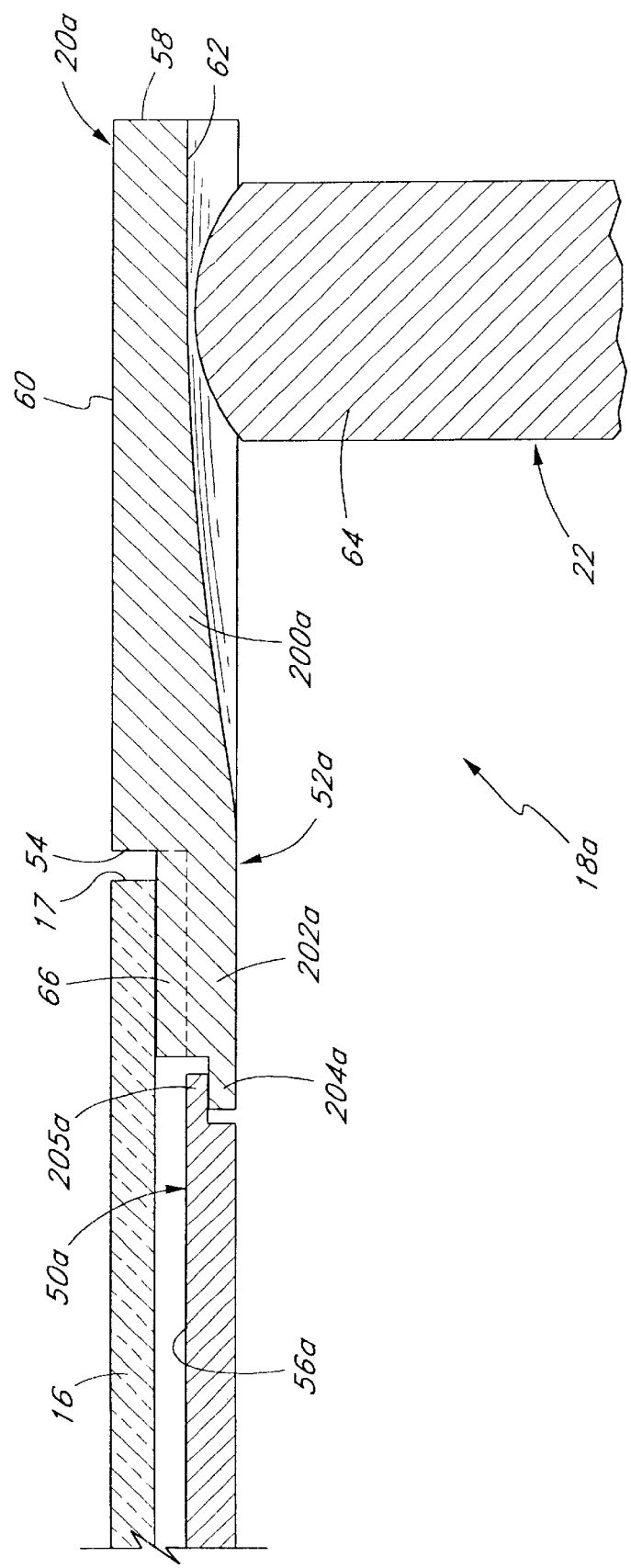
FIG. 16 is a partial, schematic sectional view of a wafer and support structure in accordance with a second preferred embodiment of the present invention.
Figure 17:
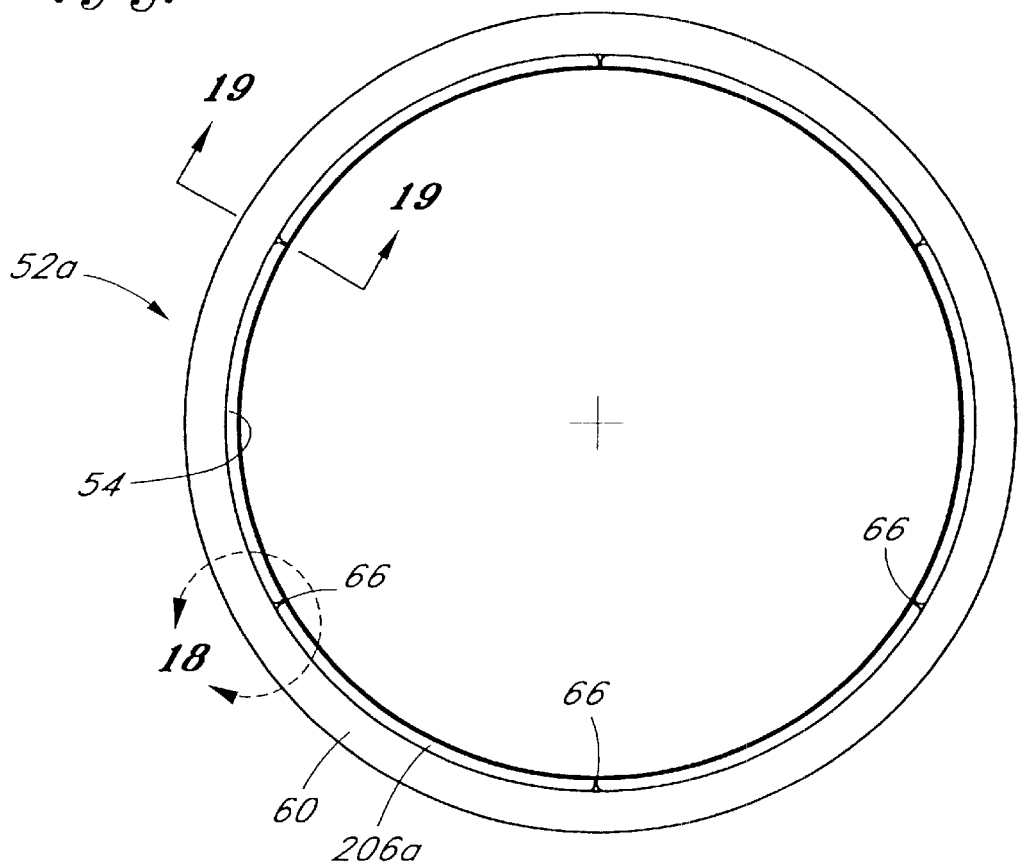
FIG. 17 is a top plan view of a support ring of the support structure of FIG. 16.
Figure 18:
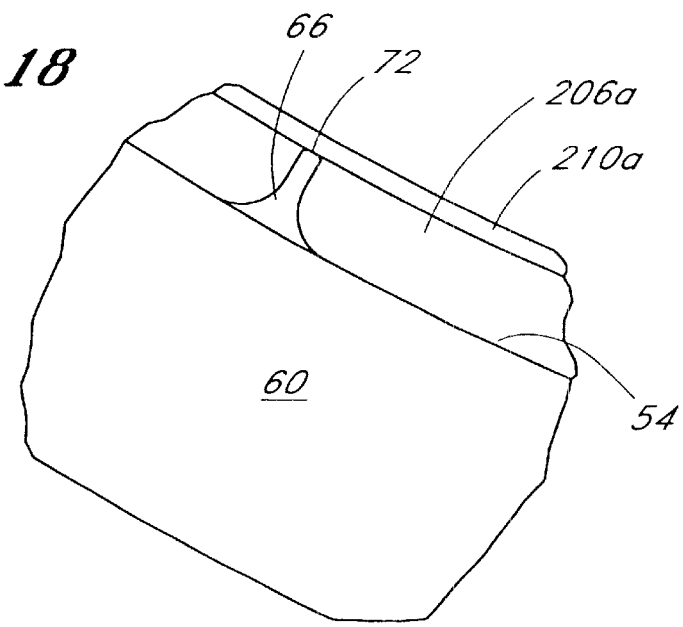
FIG. 18 is a partial enlarged view of a lip on the support ring of FIG. 17.

With reference now to FIG. 16, the wafer holder 20a is shown schematically, along with a post 64 which is as described above. As illustrated, the base plate 50a is suspended from the ring 52a. Suspension is provided by arranging a hanging portion of the base plate 50a to have a larger width or diameter (for the circular embodiment) than a supporting portion of the ring 52a. The overlapping portions thus interact, with the hanging portion of the base plate 50a above the supporting portion of the ring 52a, to provide support for the base plate 50a.

As in the first preferred embodiment, the ring 52a includes a relatively thick band 200a below the upper surface 60 and between the inner wall 54 and outer wall 58. The ring 52a further includes a relatively less thick first annular shelf 202a, radially inward from and integral with the band 200a, upon which the plurality of lips 66 are positioned. Furthermore, the ring 52a includes a relatively even less thick second or subsidiary annular shelf 204a, radially inward from and integral with the first shelf 202a. For clarity, the second shelf 204a will be hereinafter referred to as a "step" 204a, while the first shelf 202a will be hereinafter referred to as the "shelf" 202a. The base plate 50a includes an annular overhang 205a.

It will be understood that, in the illustrated embodiment, the hanging portion of the base plate 50a comprises the overhang 205a, while the support portion of the ring 52a comprises the step 204a. Thus, in the illustrated embodiment, the support by these interacting portions is provided annularly, though the support can also be provided intermittently. The skilled artisan will recognize a number of manners in which to suspend the base plate from the ring. Preferably, however, the base plate 50a and ring 52a remain independent and are not permanently mounted to one another.

With reference now to FIGS. 17–23, the ring 52a of the second preferred embodiment is illustrated. The shelf 202a is partially defined by a horizontal shelf top surface 206a, extending between a vertical shelf inner wall 208a and the band inner wall 54. The step 204a is similarly partially defined by a horizontal step upper surface 210a, extending between a vertical step inner wall 212a and the shelf inner wall 208a. Preferably, the band 200a, shelf 202a and step 204a all share a common ring bottom surface 214a. The bottom surface 214a includes the recess 62, which can be substantially identical to that of the first preferred embodiment.

The dimensions of features not specifically described here can be the same as those noted above for similar features of the first preferred embodiment. Thus, for example, the illustrated band 200a has a thickness of about 0.077 inch, as with the thickness of the ring 52 of the first preferred embodiment (see, e.g., FIG. 6), and the inner wall 54 diameter is about 7.970 inch for a 200 mm wafer, also as above.

The shelf 202a of the second preferred embodiment desirably has the same thickness as the base plate 50a (described below), and in the illustrated embodiment is about 0.0285 inch. The width of this shelf 202a, as measured along the shelf top surface 206a, is desirably the same as the lip 66, namely about 0.125 inch. This width is chosen for ease of machining, as the lip inner face 72 can be machined simultaneously flush with the shelf inner wall 208a. The height of shelf inner wall 208a, best seen from the view of FIG. 22, defines the distance below the shelf 202a that the step 204a begins, and is about 0.0105 inch in the illustrated embodiment.

The step 204a should be thick enough to support the weight of the base plate 50a (FIGS. 24–25), and wide enough to ensure that the base plate 50a remains supported rather than falling through the central opening defined by the ring 52a. In the illustrated embodiment, the thickness of the step 204a, as measured along the step inner wall 212a, is about 0.018 inch. The width of the illustrated step 204a, as measured along the step upper surface 210a, is about 0.030 inch. The inside diameter of the ring 52a, defined by the inner wall 212a, is about 7.660 inch.

As with the first preferred embodiment, corners between vertical and horizontal surfaces are each rounded with radii of about 0.010 inch, in order to improve strength.

With reference now to FIGS. 24–25, the base plate 50a of the second preferred embodiment is illustrated. The overhang 205a is partially defined by a vertical overhang wall 220a, extending downward from the base plate top surface 56a. A horizontal overhang lower surface 222a extends radially inward from the overhang wall 220a. A vertical lower base wall 224a extends downwardly from the overhang lower surface 222a.

The overall thickness of the base plate 50a is desirably the same as the shelf 202a of the ring 52a (FIGS. 17–23), or about 0.0285 inch for the illustrated embodiment, in order to provide a constant thickness of wafer holder material below the wafer 16.

The thickness of the overhang 205a is sufficient to support the weight of the entire base plate 50a by suspension upon the support portion (step 204a) of the ring 52a. Preferably, the thickness of the overhang 205a is the same as the height of the shelf inner wall 208a (see especially FIG. 22), or about 0.0105 inch for the illustrated embodiment. By providing an overhang thickness identical to the shelf inner wall height, a (discontinuous) wafer holder upper surface is advantageously provided at a constant distance from the wafer 16. The discontinuous wafer holder upper surface comprises the base plate top surface 56a together with the shelf top surface 206a (best seen in FIGS. 17 and 22) of the ring 52a.

The width of the overhang 205a is desirably about equal to the width of the step 204a upon which the overhang 205a rests in the assembled arrangement (see FIG. 16). Thus, the illustrated overhang has width, as measured along the overhang lower surface 222a, of about 0.030 inch. The outside diameter of the plate 50a, defined by the overhang wall 222a, is about 7.700 inch, which is larger than the inside radius of the ring 52a by about 0.040 inch. The step 204a of the ring 52a and the lower surface 222a of the base plate 50a thus overlap but leave a leeway of about 0.010 inch on either side. The plate 50a can thus be adequately supported by the step 204a, while the leeway accommodates both manufacturer tolerances and permits the end user to fit the plate 50a into the ring 52a during assembly.

As with most other corners of the preferred embodiments, the corner between the overhang lower surface 222a and the base lower wall 224a is rounded with about a 0.010 radius. This curvature desirably matches the curvature of the corresponding corner on the ring between the step inner wall 212 and step upper surface 210a.

Advantageously, it has been found that the two-piece wafer holder 20a of the second preferred embodiment can withstand stresses associated with thermal gradients, such as the vertical gradients described above in connection with cold wafer drop-off. Accordingly, the two-piece wafer holder 20a survives a greater number of thermal cycles, such as those encountered during normal processing, than the one-piece wafer holder 20 of the first preferred embodiment.

Figure 22:
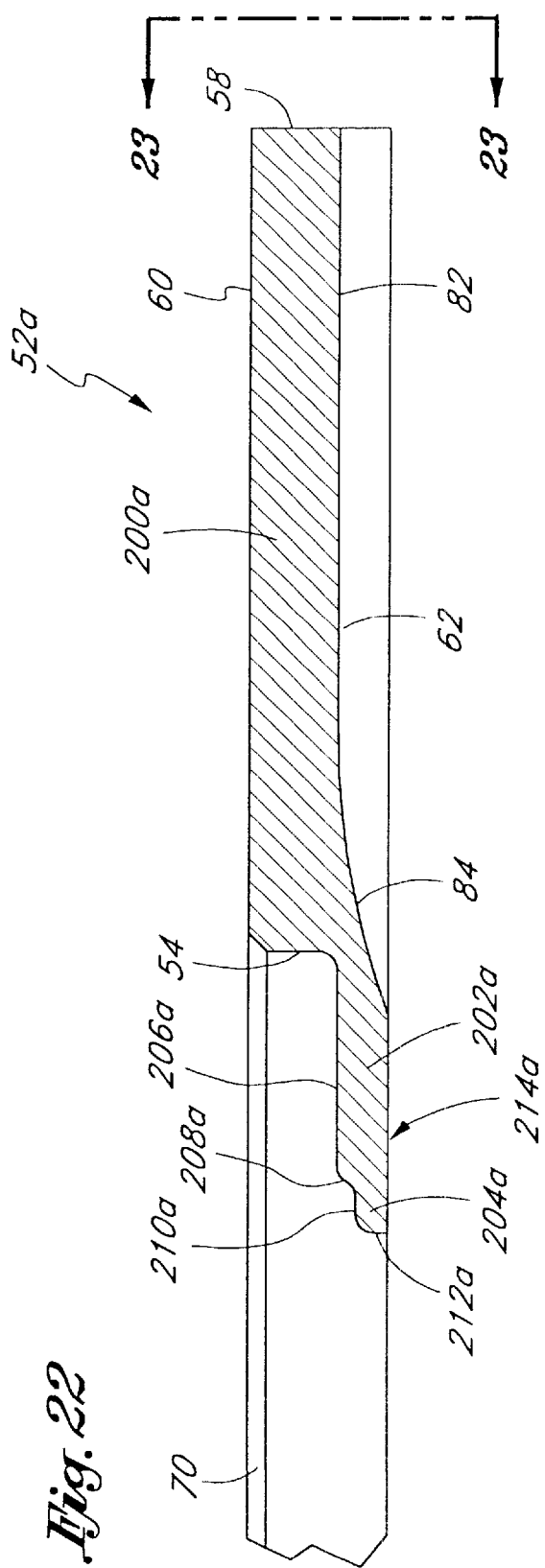
FIG. 22 is a partial elevational cross-section, taken along lines 22—22 of FIG. 21.
Figure 23:
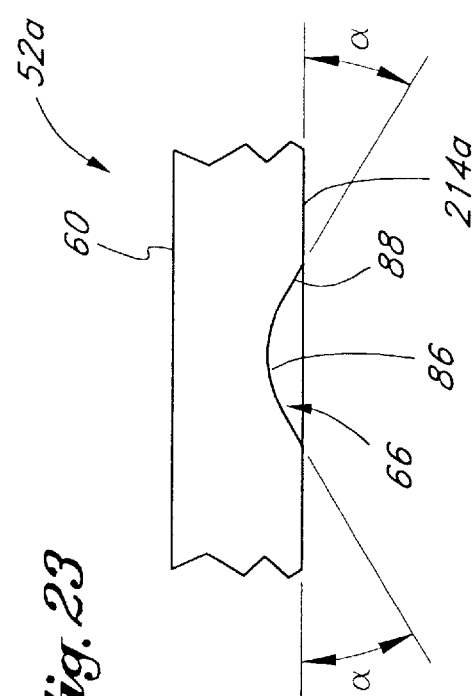
FIG. 23 is a partial elevational cross-section, taken along lines 23—23 of FIG. 22.

The advantages of various other features not specifically described remain as described for the first preferred embodiment. Thus, for example, the lips 66 and recesses 62 are not described again here. Note, however, that the recesses 62 of the second preferred embodiment are not aligned with lips 66, unlike the corresponding recesses 62 of the first preferred embodiment. A comparison of FIG. 9, showing a lip 66 in the same section with a recess 62, with FIG. 22, showing no lip in the section of the recess 62, makes this difference clear. The difference is not material, however, to the advantages described hereinabove.

Two-Piece Wafer Holder with Supporting Base

Figure 26:
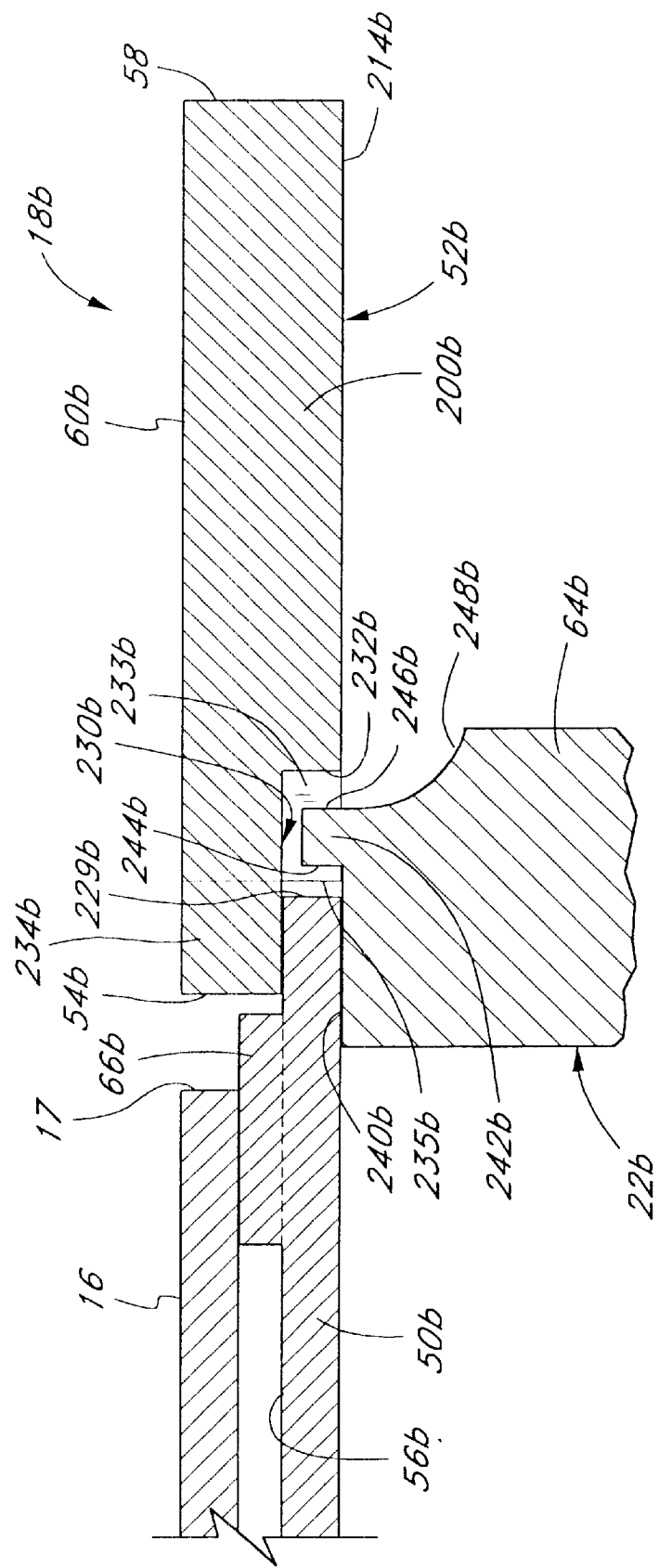
FIG. 26 is a partial, schematic sectional view of a wafer and support structure in accordance with a third preferred embodiment of the present invention.
Figure 27:
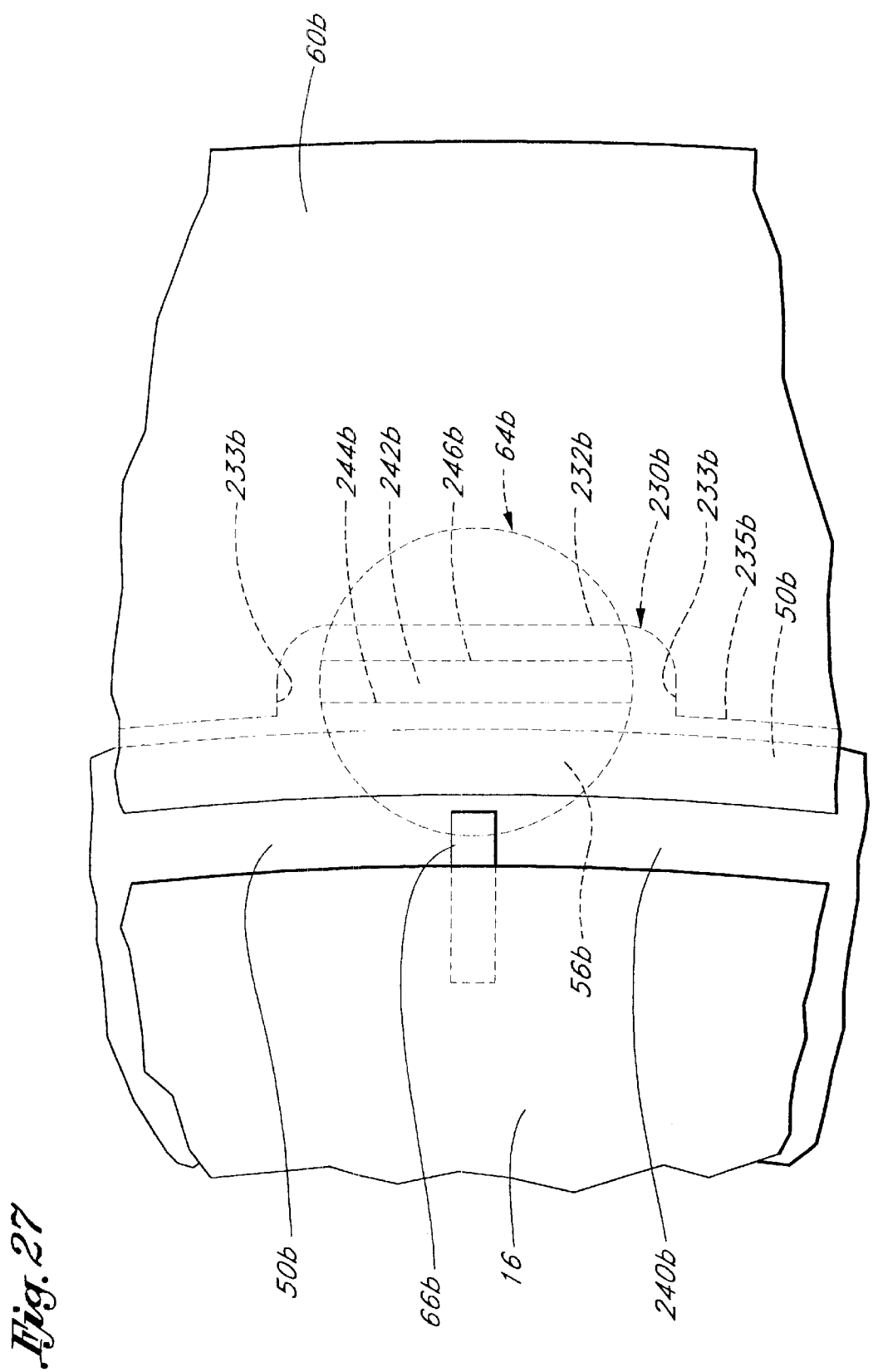
FIG. 27 is a partial top plan view of the wafer and support structure of FIG. 26.
Figure 28:
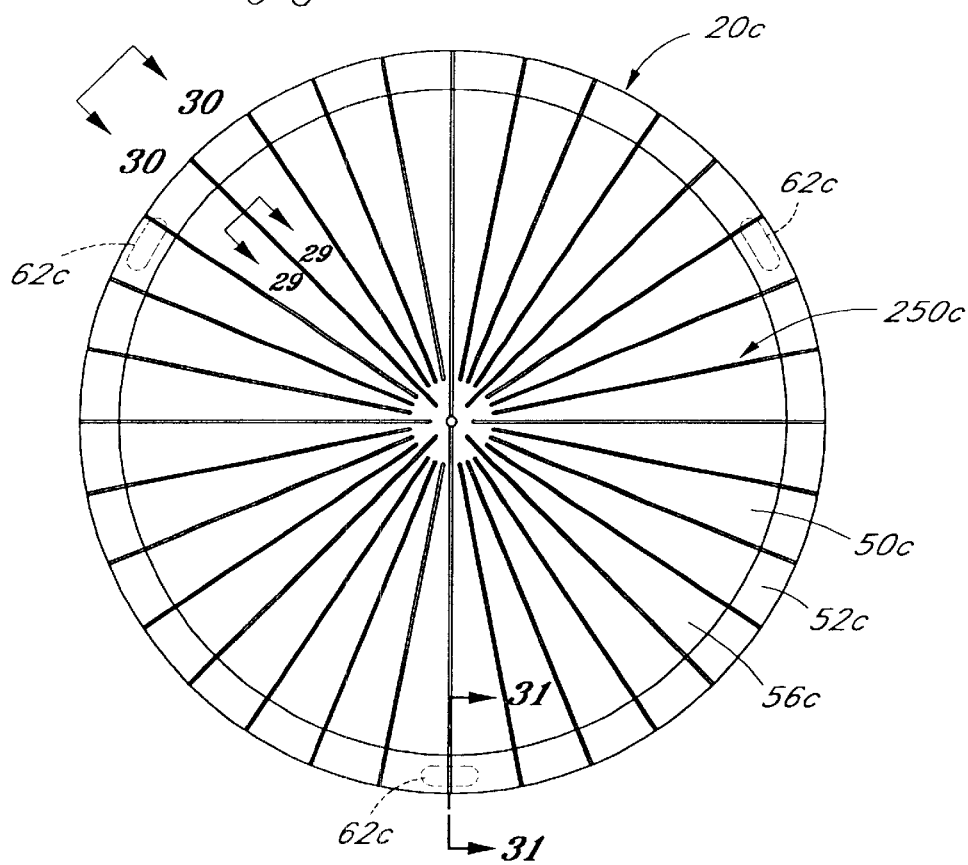
FIG. 28 is a top plan view of a wafer holder, constructed in accordance with a fourth preferred embodiment of the present invention.
Figure 29:
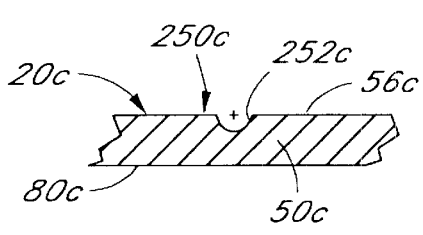
FIG. 29 is a partial elevational cross-section, taken along lines 29—29 of FIG. 28.
Figure 30:
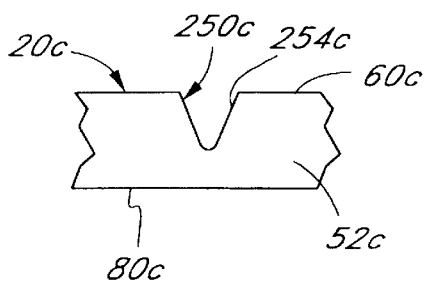
FIG. 30 is a partial elevational cross-section, taken along lines 30—30 of FIG. 28.
Figure 31:
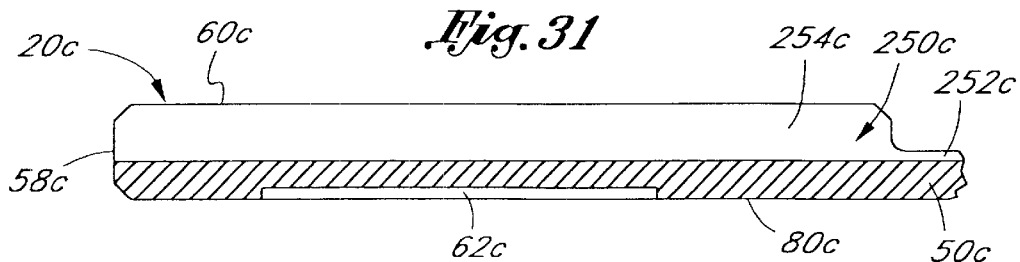
FIG. 31 is a partial elevational cross-section, taken along lines 31—31 of FIG. 28.
Figure 32:
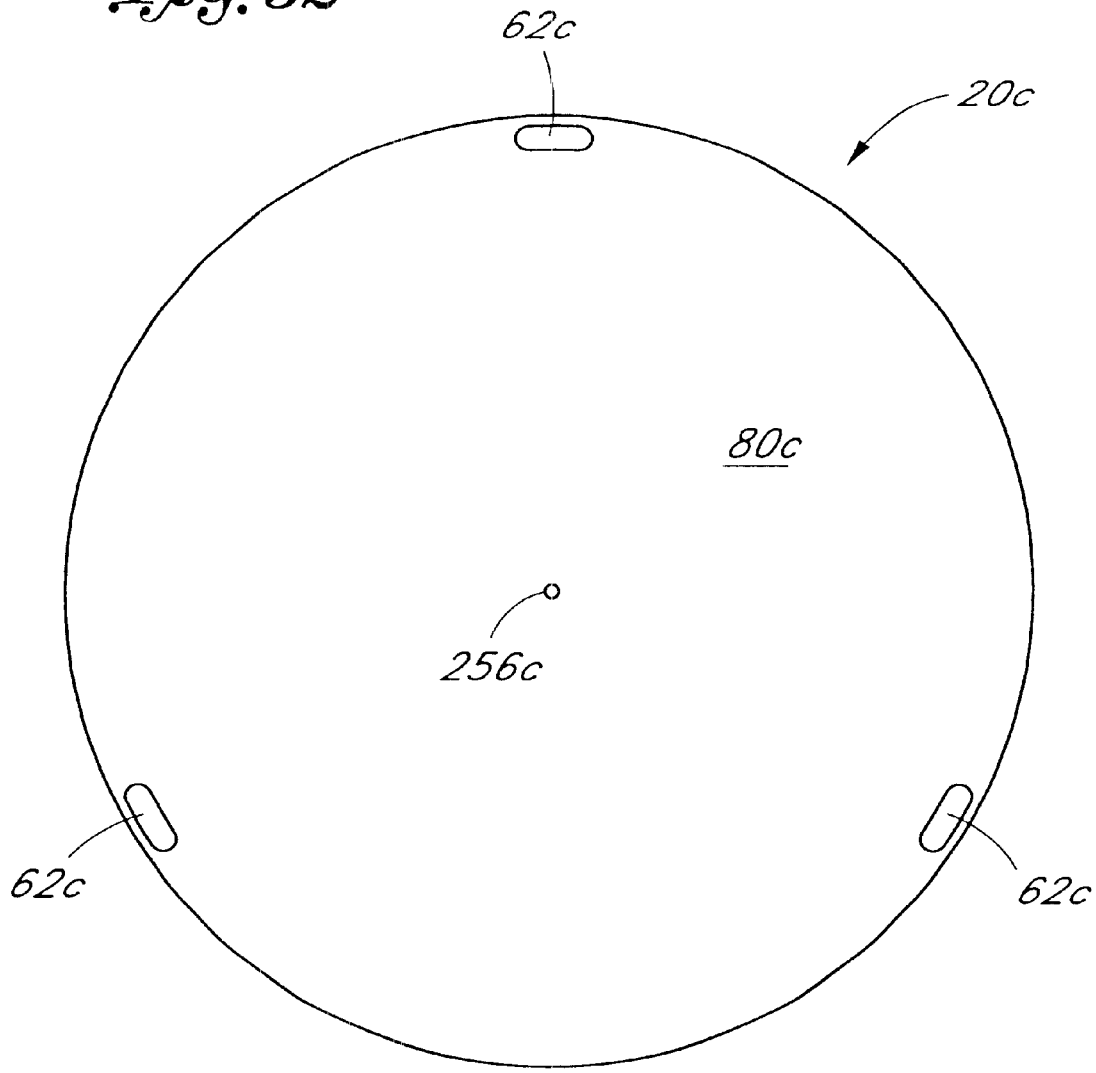
FIG. 32 is a bottom plan view of the wafer holder of FIG. 28.

With reference now to FIG. 26 and 27, a wafer support structure 18b is depicted schematically with a base-supported ring 52b, constructed in accordance with a third preferred embodiment of the present invention. The wafer support structure 18b also includes a self-centering mechanism, as described below. Desirably, the wafer support structure 18b comprises the same preferred materials as in the previous embodiments, namely SiC for the wafer holder 20b and quartz for the spider 22b. The wafer holder 20b is also preferably of low thermal mass, as described above. Numerous features are substantially the same as corresponding features of the previous embodiment, such that like reference numerals will be used to describe like features. Similar but significantly altered features will be referred to with like reference numerals with the additional suffix "b." Additionally, new features without analogous features in the first embodiment will also carry the suffix "b."

In contrast to the second preferred embodiment, wherein the base plate 50a is suspended from the ring 52a (FIG. 16), the ring 52b of the present embodiment is desirably suspended from the base plate 50b. Thus, a hanging portion of the ring 52b is arranged to have a smaller width or diameter (for the circular embodiment) than a supporting portion of the base plate 50b. The overlapping portions thus interact, with the hanging portion of the ring 52b above the supporting portion of the base plate 50b, to provide support for the ring 52b. The base plate 50b is independently supported by a spider 22b.

The base plate 50b of this embodiment can be a simple disc-shaped plate, as illustrated. Thus, the supporting portion of the base plate 50b is merely the peripheral portion of the plate 50b, just radially inward of a base plate peripheral edge 229b. In contrast to the second preferred embodiment, the plurality of lips 66b (preferably six) are formed on the base plate 50b. While illustrated schematically as separate pieces, lips 66b are desirably formed integrally with the base plate 50b, for the same reasons as described with respect to the first preferred embodiment. Preferably, the lip height is within the ranges described above, as is the lip width.

The ring 52b includes a relatively thick band 200b, and at least one recess. In the illustrated embodiment, a plurality of peg recesses 230b are positioned radially inward of the band 200b. Each peg recess 230b is defined in part by a vertical recess back wall 232b and two vertical recess side walls 233b (best seen from the top down view of FIG. 27), each extending upwardly from the ring lower surface 214b. Preferably, the ring 52b includes three peg recesses 230b distributed circumferentially at about 120° to one another, for interacting with three spider posts 64b. The dimensions of each recess 230b are chosen for a self-centering interaction with the spider posts, described in more detail below.

Desirably, each peg recess 230b extends radially inwardly and opens into an annular groove, extending around the inner lower perimeter of the ring 52b. The annular groove is defined by an overhanging ledge 234b and a vertical groove inner wall 235b, as best seen from the view of FIG. 27. The inner boundary of the ledge 234b is defined by the inner ring wall 54b, which has a diameter smaller than the outer diameter of the base plate 50b.

When assembled, the peripheral portion of the base plate 50b fits within the annular groove, such that the ledge 234b rests upon the peripheral portion of the base plate 50b, as shown. The groove inner wall 235b can be spaced slightly from peripheral edge 229b of the base plate 50b. Accordingly, in the illustrated embodiment, the overhanging portion of the ring 52b comprises the ledge 234b.

Hot and Cold Self-Centering

The base plate 50b is supported by a spider 22b, which can be similar in structure to the spider 22 of the first preferred embodiment. The spider posts 64b, however, have a different structure. Rather than the ball-end post, the spider posts 64b of the third preferred embodiment include an upward extension or protrusion with a hot centering surface and a cold centering surface. The hot centering surface desirably is proximate to or contacts an outer wall of the base plate (e.g., the base plate peripheral edge 229b) when the system is at high temperature, due to differential expansion of the base plate 50b (preferably SiC) relative to the spider 22b (preferably quartz). Similarly, the cold centering surface desirably is proximate to or contacts an inner wall of the ring 52b (e.g., the recess back wall 232b) when the system is at low temperature, due to differential contraction of the ring 52b relative to the spider 22b. "Proximate to," within the meaning of the present disclosure, means that the centering surface should be within about 0.020 inch of a vertical wafer holder surface, and more preferably within about 0.010 inch.

In the illustrated embodiment, the post end includes a platform 240b on the inner side of the post 64. The base plate 50b rests upon the platform 240b. For the cylindrical post, this platform 240b has the shape of a truncated circle (see FIG. 27). At the radially outward edge of the platform 240b, a centering protrusion or peg 242b extends upwardly into the recess 230b of the ring 52b. The centering peg 242b includes an inner hot centering surface 244b and an outer cold centering surface 246b. In the illustrated embodiment, the cold centering surface 246b extends downwardly into an outwardly curved flared surface 248b, which in turn joins the vertical cylindrical outer surface of the main portion of the spider post 64b.

As noted, the hot centering surface 244b is proximate to or contacts the peripheral edge 229b of the base plate 50b during high temperature steps, for example at about 1200° C. It will be understood that, because at least three such hot centering surfaces 244b on at least three different spider posts 64b are distributed about the periphery of the base plate 50b, the base plate 50b is confined to negligible movement. Accordingly, the integral lips 66b which support the wafer 16 are also confined. The ring 52b rests upon the base plate 50b and has its movement limited by interaction of the lips 66b with the ring inner wall 54b, and/or by the interaction between the groove inner wall 235b and the peripheral edge 229b of the base plate 50b, depending on which two surfaces have the closer spacing.

Similarly, the cold centering surface 246b is proximate to or contacts the recess back wall 232b of the ring 52b during lower temperature steps, e.g., 20° C. It will be understood that, because at least three such cold centering surfaces 246b (on three different spider posts 64b) each contact one of at least three recess back walls 232b distributed about the ring 52b, the ring 52b is confined to negligible movement. The ring 52b, in turn, constrains movement of the base plate 50b and the wafer 16 thereon by interaction of the groove inner wall 235b with the peripheral edge 229b of the base plate 50b, or by interaction of the ring inner wall 54b with the lips 66b.

In the illustrated embodiment, the recess side walls 233b can interact with the spider posts 64b to prevent rotation of the ring 52b relative to the spider 22b, and can "clock" or ensure transfer of rotational drive from the spider 22b to the ring 52b, such that they rotate together. Friction between the ring 52b and the base plate 50b, and between the base plate 50b and the spider post platform 240b, couples the ring rotation to the base plate 50b, such that the entire wafer holder 20b (and the wafer held thereon) rotates together with the spider 22b.

It will be understood, however, that rotation of the spider can be transferred to the wafer holder without the illustrated recess structure. For example, a radially wider ledge can be formed by extending the annular groove radially outward to form a groove inner wall at the same radial distance at which the recess back wall 232b is illustrated in FIGS. 26–27. In such an alternative arrangement, the groove inner wall would interact with the cold centering surface 246b of the spider post 64b under lower temperature conditions, similarly to the centering function as described for the illustrated embodiment. In such an alternative arrangement, friction between the spider post platform and the base plate lower surface could adequately couple the spider and the base plate for purposes of rotation. The base plate, in turn, would also be frictionally coupled to the ring by the weight of the ring concentrated upon the peripheral portion of the base plate at the extended annular ledge.

Wafer Holder with Upper Gas Passages

With reference now to FIGS. 28–32, a wafer holder 20c, constructed in accordance with a fourth preferred embodiment of the present invention, facilitates wafer pick-up. Desirably, the wafer support structure comprises the same preferred materials as in the previous embodiments, namely SiC for the wafer holder 20c and quartz for the spider (not shown). The wafer holder 20c is also preferably of low thermal mass, as described above. Numerous features are similar or substantially the same as corresponding features of the previous embodiment, such that like reference numerals will be used to describe like features. Similar but significantly altered features will be referred to with like reference numerals with the additional suffix "c." Additionally, new features without analogous features in the previous embodiments will also carry the suffix "c."

As with the first preferred embodiment, the wafer holder 20c is a unitary piece comprising a central base plate 50c, with a relatively more thick peripheral annular ring 52c. The wafer (not shown) can fit within a basin defined by the thicker ring 52c. Structures are also provided to permit gas between the wafer and the wafer holder 20c. Like the lips of the previously described embodiments, the structures include dimensions selected to prevent undue thermal disturbance in the wafer. In the illustrated embodiment, gas fills gas passages formed in an upper surface of the wafer holder.

In particular, a plurality of open radial channels 250c are provided in the top surface of the wafer holder 250c to serve as gas passages. In the illustrated embodiment, each channel 250c comprises a base plate channel 252c and a ring channel 254c. This configuration advantageously allows machining each channel 250c at a constant depth across the entire wafer holder 20c. Moreover, the ring channel 254c provides a large gas flow path to the base plate channel 252c for gas to enter as the wafer is picked up.

The base plate channels 252c, which are directly below the wafer just before wafer pick-up, have a width less than the thermal diffusion length in silicon (about 5 mm). Accordingly, the thermal effect upon the wafer, from the absence of material within the channels 252c, is negligible. Preferably, the base plate channels 252c have a depth of about 0.010 inch and a width of about 0.015 inch. It will be understood that the illustrated ring channels 254c, machined to the same level as the base plate channels 252c, are both deeper and wider (compare FIGS. 29 and 30). The thermal effect of the ring channels 254c, however, is attenuated relative to the base plate channels 252c.

Because the base plate channels 252c are so narrow, a plurality of channels 252c is provided to give a total volume of gas passages which is adequate for separately lifting the wafer. In the illustrated embodiment, 32 such channels 252c are provided.

The one-piece wafer holder 20c includes a common lower surface 80c. Three or more recesses 62c are provided in the lower surface 80c. The recesses 62c are provided for interaction with a similar number of spider posts (not shown), which can support and impart rotation to the wafer holder 20c, as described with respect to the previous embodiments. The spider posts can be configured with hot- and cold-centering surfaces spaced to anticipate differential thermal expansion and contraction, as will be understood by one of skill in the art in light of the above disclosure with respect to the third preferred embodiment.

Additionally, a central opening 256c is provided through the wafer holder 20c. Desirably, the central opening 256c is sized to receive a thermocouple. The thermocouple can thereby read the temperature in close proximity to the wafer during processing, and the heat lamps outside the reaction chamber can be controlled accordingly. Furthermore, as the thermocouple extends through a central hub on a spider (see FIG. 14), the thermocouple can keep the wafer holder 20c centered during rotation and thermal cycling, regardless of thermal expansion.

Wafer Holders with Lower Gas Passages

FIGS. 33–37 illustrate wafer holders which provide one or more lower gas passages. The lower gas passages allow gas to flow into the gap between the base plate and the wafer while the wafer is being picked up, and out of the gap while the wafer is being dropped off. In each of the illustrated embodiments, the support ring is provided with a single annular lip with a cylindrical inner face, rather than a plurality of spaced lips. The annular lip still spaces the wafer above a base plate. It will be understood, however, that in other arrangements the backside gas flow can be combined with the front side gas flow between spaced lips, such that adequate gas flow is ensured between the wafer and wafer holder during pick-up and drop-off.

Figure 33:
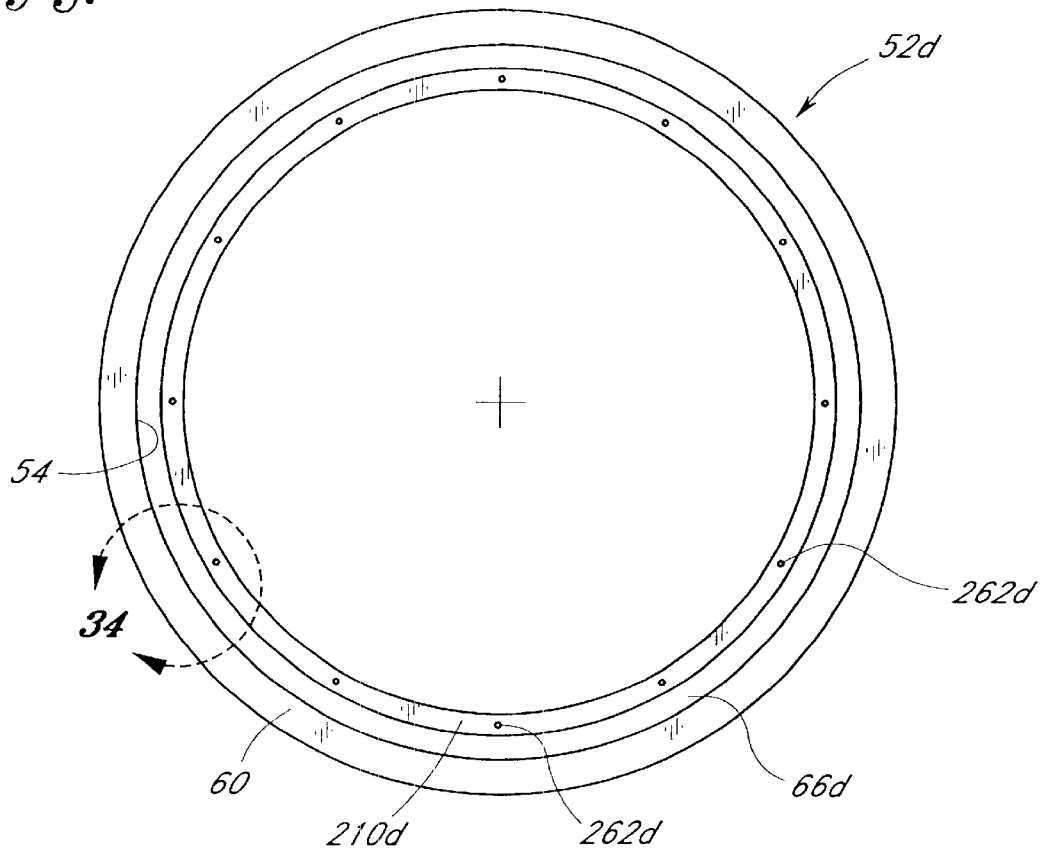
FIG. 33 is a top plan view of a support ring of a wafer holder, constructed in accordance with a fifth preferred embodiment of the present invention.
Figure 34:
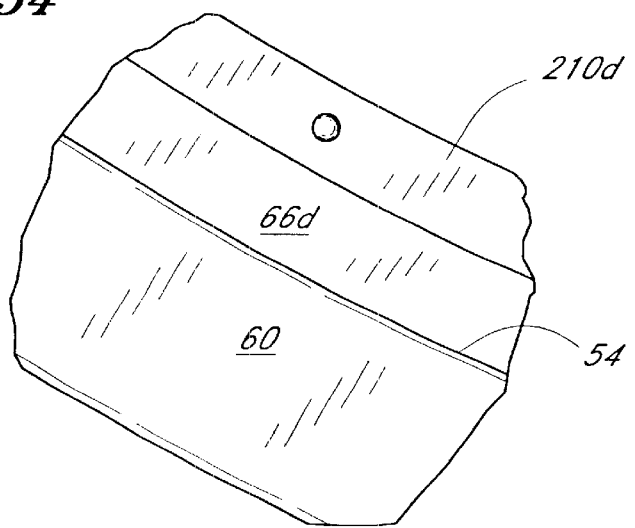
FIG. 34 is a partial enlarged view of a bump on the support ring of FIG. 33.

With reference to FIGS. 33–35, a two-piece wafer holder 20d is illustrated in accordance with a fifth preferred embodiment. As with previous embodiments, the wafer holder 20d desirably comprises the same preferred materials as in the previous embodiments, namely SiC for the wafer holder 20d and quartz for the spider (not shown). The wafer holder 20d is also preferably of low thermal mass, as described above. Numerous features are similar or substantially the same as corresponding features of the previous embodiment, such that like reference numerals will be used to describe like features. Similar but significantly altered features will be referred to with like reference numerals with the additional suffix "d." Additionally, new features without analogous features in the previous embodiments will also carry the suffix "d." Similarly, reference numerals for altered or new features of a sixth preferred embodiment will carry the suffix "e" in FIG. 36.

Referring again to FIGS. 33–35, preferably a single annular lip 66d is provided, such as to effectively seal the front side of the wafer 16 from the back side. Such an arrangement effectively eliminates the diffusion of processing gas to the backside from the front side of the wafer 16. This seal would ordinarily create a vacuum effect during wafer pick-up. In the illustrated embodiment, however, an annular backside passage 260d (FIG. 35) is provided between the ring 52d and the base plate 50d, and specifically between ring step 204d and the base plate overhang 205d. As a wafer is picked up after processing, gas is drawn up from below the wafer holder through the backside passage 260d, preventing the base plate 50d from sticking to the wafer 16 by a vacuum effect. For example, purge gas will generally be present below the wafer holder 20d, both during and after processing. It will be understood that the backside passage 260d similarly allows gas flow outward (downward) from the gap during wafer drop-off.

The backside passage 260d is provided in the illustrated embodiment by a plurality of bumps 262d positioned about the upper surface 210d of the ring step 204d. Desirably, more than three bumps 262d are provided to support the base plate 50d levelly, while the number and size of the bumps are small enough to permit sufficient gas flow through the passage 260d for the wafer 16 to be picked up independently of the base plate 50d. Preferably six or more bumps are provided, while twelve such bumps 262d are illustrated in the plan view of FIG. 33. The thickness of the ring step 204d and the base plate overhang 205d can be adjusted, within the dictates of structural strength requirements, to maintain the gap between the base plate 50d and the wafer 16, as described above, as will be understood by one of skill in the art.

While the backside passage 260d of the illustrated embodiment allows gas to be drawn through to the gap between the wafer 16 and the wafer holder 20d during wafer pick-up, gas will tend not to flow during processing, as the front side is effectively sealed by contact between the wafer 16 and the annular lip 66d. Combined with the fact that the preferred reactor 10 provides mostly purge gas below the wafer holder 20*d*, the lack of flow effectively eliminates the ability of deposition gases (or other reactant species) to reach the backside of the wafer.

Advantageously, the arrangement illustrated in FIG. 35 provides the backside passage 260*d* in a stepped path, such that radiant heat does not directly penetrate from lamps to the wafer 16 and hot spots are avoided.

Referring now to FIG. 36, a wafer holder 20*e* is shown in accordance with a sixth preferred embodiment of the present invention. A lower gas passage is provided in the form of at least one conduit 270*e* leading from the underside of the wafer holder 20*e* to the gap between the base plate 50*e* and the wafer 16. Preferably, the conduit 270*e* leads from the underside of the ring 52*e* to the side wall of the annular lip 66*e*. Similarly to the annular backside passage 260*d* of the previously described embodiment, the conduit 270*e* allows gas to fill the gap while the wafer is being lifted, thus reducing any vacuum effect which could otherwise cause the baseplate 50*e* to be lifted with the wafer. Similarly, the conduit 270*e* can also allow gas to exit the gap between the wafer 16 and base plate 50*e* during wafer drop, thus preventing the wafer from floating off center.

Desirably, three conduits 270*e* are provided, aligned with posts 64*e* of a spider 22*e*. Each of the conduits 270*e* connects to a hollow spider post 64*e*, through which gas can flow, at least during wafer pick-up and desirably also during wafer drop-off. Preferably, a purge gas line is connected to the hollow spider 22*e*, accessing purge gas.

The purge gas line is most preferably connected to the same gas line flowing purge gas to a pick-up wand of the type described in U.S. Pat. No. 4,846,102. Thus, in the preferred embodiment, the purge gas would flow through the spider post 64*e* and the conduit 270*e* only during when the pick-up wand is operating, such that no flow would be forced into the gap during wafer processing. Overpressure from the gas flow can also be avoided by providing obstructions in the hollow spider 22*e*, to restrict gas flow into the wafer-base plate gap.

Apart from the conduit 270*e* and the annular lip 66*e*, the wafer holder 20*e* can be as described with respect to the second preferred embodiment.

Desirably, the conduits 270*e* are angled inwardly as shown, such as to avoid lamp radiation directly falling on the wafer.

FIG. 37 illustrates a wafer holder 20*f* constructed in accordance with a seventh preferred embodiment, incorporating features of both the fifth and sixth preferred embodiments. By providing both conduits 270*e* and the annular backside passage 260*d*, the wafer holder 20*f* can provide a greater rate of gas flow into the gap during wafer pick-up. Such an amount of flow may be desirable, for example, for use during pick-up of high surface area wafers, or for ultra-light wafer holders which could easily be lifted along with the wafer.

Hot Centering Wafer Support

Figure 38:
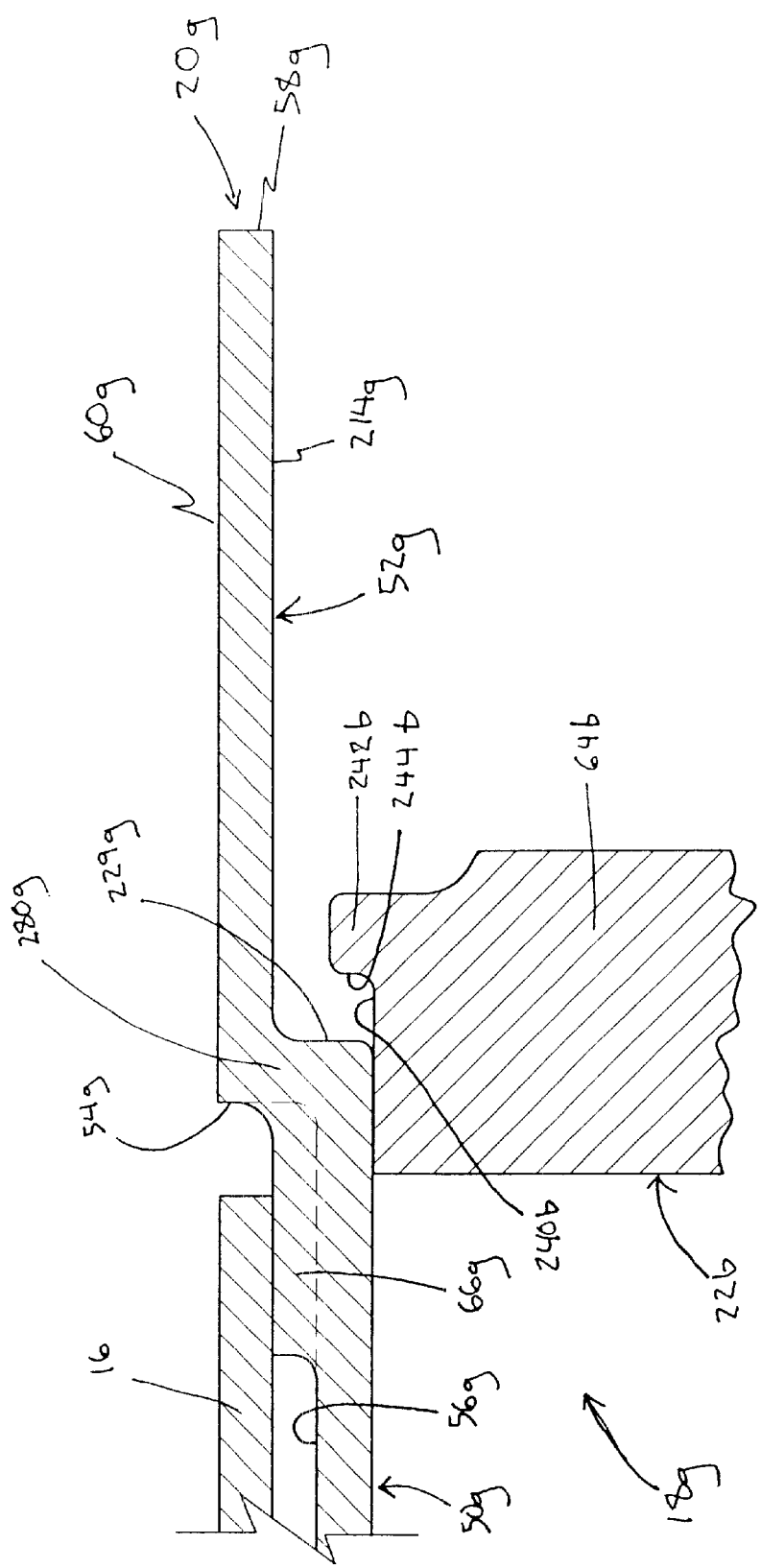
FIG. 38 is a partial schematic sectional view of a wafer holder constructed in accordance with a eighth preferred embodiment of the present invention.

With reference now to FIGS. 37 and 38, two wafer support structures 18*g*, 18*h* are depicted schematically, constructed in accordance with eighth and ninth embodiments of the present invention, respectively. Desirably, the wafer support structures 18*g*, 18*h* comprise the same preferred materials as in the previous embodiments, namely SiC for the wafer holders 20*g*, 20*h* and quartz for the respective spiders 22*b*, 22*h*. The wafer holders 20*g* are also preferably of low thermal mass, as described above.

Numerous features are substantially the same as corresponding features of the previous embodiment, such that like reference numerals will be used to describe like features. For example, the spider of FIG. 38 can be identical to that illustrated in FIG. 26, such that the reference numeral 22*b* is employed. Similar but significantly altered features will be referred to with like reference numerals with the additional suffixes "g" and "h." Additionally, new features without analogous features in the first embodiment will also carry the suffixes "g" and "h."

Figure 39:
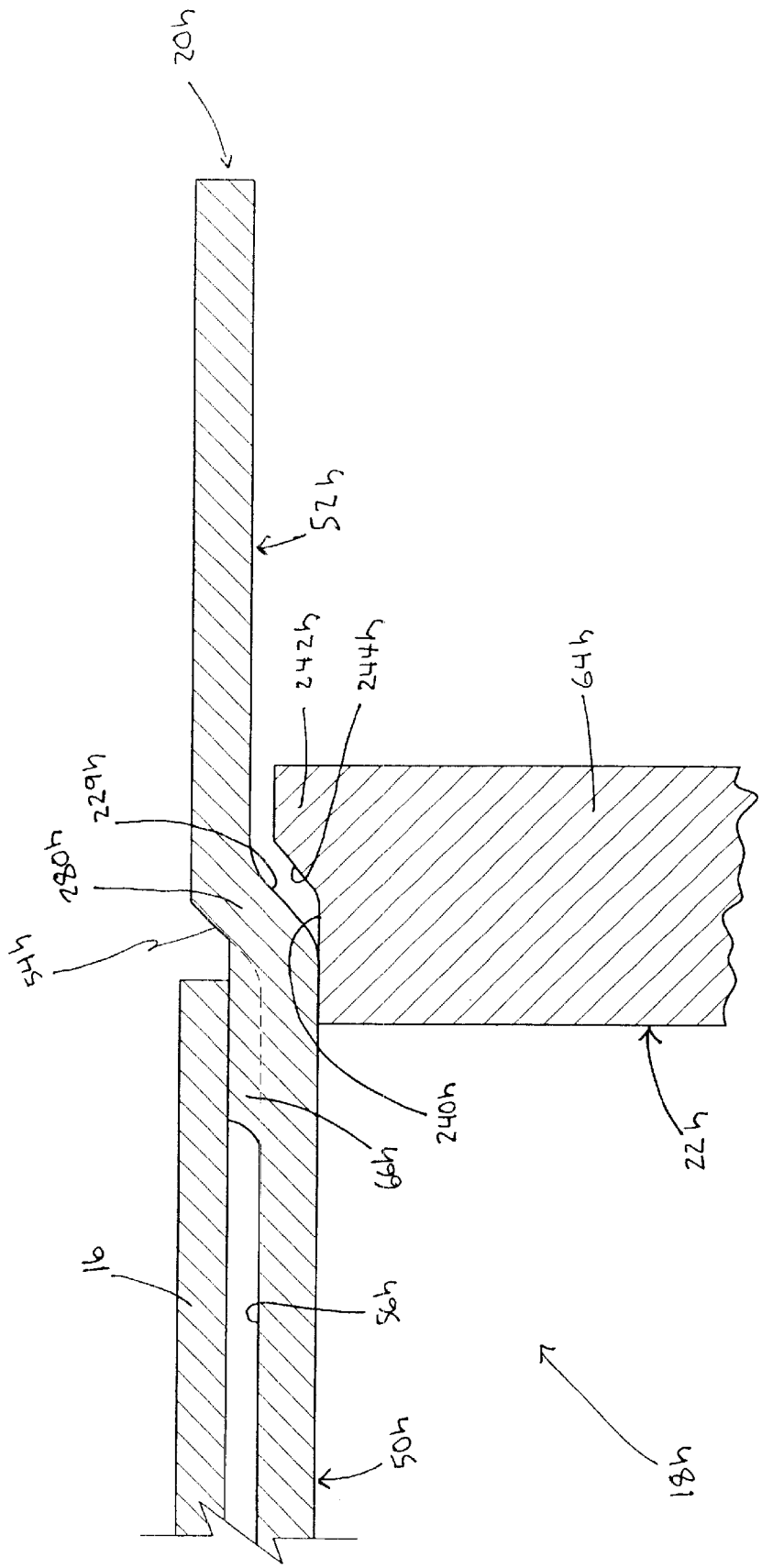
FIG. 39 is a partial schematic sectional view of a wafer holder constructed in accordance with a ninth preferred embodiment of the present invention.

Like the second preferred embodiment (FIGS. 26–27), each of the embodiments of FIGS. 38 and 39 feature mechanisms which are self-centering at high temperatures. The principal differences between the second embodiment and FIGS. 38–39 are: the eighth and ninth embodiments do not include cold centering features; the base plates 50*g*, 50*h* and ring portions 52*g*, 52*h* are integral or one piece; the ring portions 52*g*, 52*h* are substantially the same thickness as their corresponding base plates 50*g*, 50*h*; and the wafer holders 20*g*, 20*h* do not include peg recesses to aid rotational coupling to the corresponding spiders 22*b*, 22*h*. Each of these features, which are common to both eighth and ninth embodiments, are individually and synergistically advantageous from thermal and manufacturing viewpoints.

With reference initially to FIG. 38, as noted, the wafer holder 20*g* of the eight embodiment is preferably one piece and the base plate 50*g* and ring portion 52*g* have substantially uniform thickness. As with the previous embodiments, the base plate thickness is close to that of the wafer it is to hold (e.g., about 0.0285 inch for a 200 mm wafer or about 0.0305 inch for a 300 mm wafer). A transition portion 280*g* connects the integral base plate 50*g* and ring portion 52*g*. The transition portion 280*g* is an annular step which defines the wafer pocket. A plurality of lips 66*g* (preferably six), similar to the lips of previously described embodiments, extend integrally from the base plate 50*g*, defining a gap between the supported wafer 16 and the top surface 56*g* of the base plate 50*g*. To form the wafer pocket with the appropriate gap, the transition portion 280*g* has a vertical thickness of about 0.077 inch (for the 200 mnm wafer support), forming a vertical transition inner wall 54*g* (also defining an inner edge of the ring portion 52*g*) and a vertical transition outer wall 229*g* (also defining an outer edge of the base plate 50*g*).

The base plate 50*g* is supported by the spider 22*b*, and particularly by three spider posts 64*b*. The tip of each post 64*b* includes a platform 240*b* on the inner side of the post 64*b*. The base plate 50*g* of the wafer holder 20*g* rests upon the platform 240*b*. In operation, the rotation of the spider 22*b* is transferred or coupled to the wafer holder 20*g* by friction between the spider post platform 240*g* and the base plate lower surface.

Each of the posts 64*b* also include an upward extension or protrusion with a hot centering surface. In particular, the post protrusion comprises the centering peg 242*b* having an inner hot centering surface 244*b*. As with the embodiment of FIG. 26, the hot centering surface 244*b* is desirably proximate to or contacts an outer vertical wall of the wafer holder 20*g* (e.g., the transition outer wall 229*g*) when the system is at high temperature (e.g., at about 1200° C.), due to differential expansion of 30 the base plate 50*g* (preferably SiC) relative to the spider 22*b* (preferably quartz). "Proximate to," within the meaning of the present disclosure, means that the centering surface of the spider 22*b* should be within about 0.020 inch of a vertical wafer holder surface, and more preferably within about 0.010 inch. It will be understood that, because at least three such hot centering surfaces 244*b* on at least three different spider posts 64*b* are distributed about the periphery of the base plate 50*g*, the base plate 50*g* is confined to negligible movement.

Advantageously, the embodiment of FIG. 38 includes many of the advantages of the previously disclosed embodiments. For example, the wafer holder 20g is self-centering at high temperatures, when thermal uniformity is most difficult to achieve, and most important to achieve. Additionally, rotational coupling also promotes uniform thermal effects. The illustrated embodiments, however, accomplish both hot centering and rotational coupling with fewer sharp internal corners (such as those created by the peg recesses shown in FIGS. 26 and 27). Such sharp corners tend to concentrate thermal, electrical and physical stresses. Naturally, reduction of corners also simplifies manufacturing.

Cross-sectional (thickness) uniformity of the ring 52g and base plate 50g also enables uniform temperatures across the wafer holder 20g. Essentially, the rate at which temperature increases during heating is proportional to the area receiving radiation divided by the thickness of the wafer holder 20g. Temperature non-uniformities, during certain thermal processes, can cause large enough stress to result in breakage of the wafer holder. For such processes, uniform thickness to avoid breakage is more important than edge loss compensation by use of a thicker ring portion.

With reference now to FIG. 39, the ninth preferred embodiment offers similar advantages. As with the embodiment of FIG. 39, the wafer holder 20g includes substantially uniformly thick base plate 50h and ring 52h portions, which are also integrally formed as one piece. The transition portion 280h, however, is angled outwardly, rather than being completely vertical. Preferably, the transition 280h forms an angle with the ring 52h and base plate 50h of between about 30° and 60°, and is shown at about 45° in FIG. 39. The transition portion 280h is thus defined between an annular and angled transition inner wall 54h and an outer wall 229h.

The wafer holder 20h, and particularly the base plate 50h, rests on inner platforms 240h of the spider posts 64h, rotationally coupled to the spider 22h by friction. The post protrusion 242h includes an angled hot centering surface 244h. At high temperatures, as the wafer holder 20h expands relative to the spider 22h. The holder's outer wall 229h mates with the hot centering surfaces 244h of each of the posts 64h (preferably at least three), keeping the wafer holder 20h (and thus the wafer 16) centered within a tightly confined space.

The embodiment of FIG. 39 entails similar advantages as those of FIG. 38. Additionally, the angled transition portion 280h reduces the effective thickness of the transition region. For example, comparing equivalent wafer holders of the eighth and ninth embodiments, the vertical transition portion 280g of FIG. 38 has a thickness of about 0.077", while the angled transition portion 280h of FIG. 39 has an effective vertical thickness of about 0.040". Accordingly, the ninth embodiment experiences even fewer thermal non-uniformities during thermal processing, resulting in reduced breakage. Furthermore, the angle reduces the sharpness of corners and attendant stresses.

It will be appreciated by those skilled in the art that various modifications and changes may be made without departing from the scope of the invention, and all such modifications and changes are intended to fall within the scope of the invention, as defined by the appended claims.

We claim:

1. A wafer holder for supporting a single substrate in a processing chamber, comprising:

a disc-shaped base plate;

an annular ring independent of the base plate;

an annular hanging portion integral with the base plate; and an annular supporting portion integral with the ring, the supporting portion underlying and supporting the hanging portion;

wherein the annular ring defines outer radial dimensions of a pocket configured to closely receive a fitting substrate supported by the wafer holder, the wafer holder having a thermal mass less than about five times a thermal mass of the fitting substrate;

wherein the wafer holder includes at least one passage forming a gas flow path from below the wafer holder to a region above the base plate, the at least one passage oriented at an acute angle with respect to vertical.

2. The wafer holder of claim 1, wherein the wafer holder has a thermal mass less than about three times a thermal mass of the fitting substrate.

3. The wafer holder of claim 2, wherein the thermal mass of the wafer holder is between about 0.5 and 2.0 times the thermal mass of the fitting substrate.

4. The wafer holder of claim 1, wherein the wafer holder consists essentially of silicon carbide.

5. The wafer holder of claim 1, wherein the hanging portion comprises an overhang of the base plate, extending radially outward from a central portion of the base plate, and the supporting portion comprises a step of the ring, extending radially inward from an outer portion of the ring.

6. The wafer holder of claim 5, wherein the outer portion of the ring comprises an annular shelf extending radially outward from the step and having a thickness equal to that of the central portion of the base plate, the thickness of the base overhang and the ring step selected such that an upper surface of the base plate is flush with an upper surface of the shelf and a lower surface of the base plate is flush with a lower surface of the ring.

7. The wafer holder of claim 5, wherein the step of the ring includes a plurality of bumps defining an annular backside passage between the step and the overhang of the base plate.

8. The wafer holder of claim 1, further comprising a plurality of spacers configured to support a substrate at a uniform height above the base plate.

9. The wafer holder of claim 1, wherein the at least one passage is formed within the ring.

10. The wafer holder of claim 9, wherein a plurality of bumps are formed on the supporting portion, the bumps forming an opening between the hanging portion and the supporting portion.

11. The wafer holder of claim 1, wherein the wafer holder includes three passages forming gas flow paths from below the wafer holder to the region above the base plate, each of the passages oriented at an acute angle with respect to vertical.

12. The wafer holder of claim 1, wherein an opening is formed between the hanging portion and the supporting portion.

13. The wafer holder of claim 12, wherein the opening is formed by a plurality of bumps on the supporting portion.

14. A wafer holder for supporting a single substrate in a processing chamber, comprising:

a disc-shaped base plate;

an annular ring independent of the base plate;

an annular hanging portion integral with the base plate, the hanging portion comprising an overhang of the base plate and extending radially outward from a central portion of the base plate; and an annular supporting portion integral with the ring, the supporting portion comprising a step of the ring and extending radially inward from an outer portion of the ring, the supporting portion underlying and supporting the hanging portion, the step of the ring including a plurality of bumps defining an annular backside passage between the step and the overhang of the base plate.

* * * * *